(12) United States Patent
Shiraishi et al.

(10) Patent No.: US 11,350,220 B2
(45) Date of Patent: May 31, 2022

(54) MEMS PACKAGE, MEMS MICROPHONE AND METHOD OF MANUFACTURING THE MEMS PACKAGE

(71) Applicant: SAE Magnetics (H.K.) Ltd., Hong Kong (HK)

(72) Inventors: Masashi Shiraishi, Hong Kong (HK); Hironobu Hayashi, Hong Kong (HK); Toyotaka Kobayashi, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 301 days.

(21) Appl. No.: 16/745,407

(22) Filed: Jan. 17, 2020

(65) Prior Publication Data

US 2021/0227334 A1 Jul. 22, 2021

(51) Int. Cl.
*H04R 3/00* (2006.01)
*H04R 19/04* (2006.01)
*H04R 19/00* (2006.01)
*H04R 1/04* (2006.01)
*H04R 7/04* (2006.01)
*B81B 7/00* (2006.01)
*B81C 1/00* (2006.01)
*H04R 31/00* (2006.01)

(52) U.S. Cl.
CPC ......... *H04R 19/04* (2013.01); *B81B 7/0029* (2013.01); *B81C 1/00325* (2013.01); *H04R 1/04* (2013.01); *H04R 7/04* (2013.01); *H04R 19/005* (2013.01); *H04R 31/006* (2013.01); *B81B 2201/0257* (2013.01); *H04R 2201/003* (2013.01)

(58) Field of Classification Search
CPC ....................................................... H04R 3/00
See application file for complete search history.

(56) References Cited

U.S. PATENT DOCUMENTS

| 7,808,060 | B2 * | 10/2010 | Hsiao | B81C 1/00238 257/416 |
| 8,072,081 | B2 * | 12/2011 | Wang | B81C 1/00269 257/776 |
| 9,936,306 | B1 * | 4/2018 | Zhang | B81B 7/0061 |
| 10,519,030 | B2 * | 12/2019 | Elian | B81B 7/0035 |
| 2007/0190680 | A1 * | 8/2007 | Fukuda | B81B 3/0072 438/50 |
| 2008/0175425 | A1 * | 7/2008 | Roberts | H04R 19/005 381/361 |
| 2008/0310663 | A1 * | 12/2008 | Shirasaka | H04R 19/016 438/51 |

(Continued)

FOREIGN PATENT DOCUMENTS

| JP | 2012114672 A | 6/2012 |
| JP | 5422189 B2 | 2/2014 |

(Continued)

*Primary Examiner* — Olisa Anwah

(57) ABSTRACT

A MEMS package has a MEMS chip, a package substrate which the MEMS chip is adhered, a chip cover which wraps the MEMS chip, and a pressure regulation film which is adhered to the front surface of the chip cover. The chip cover has a vent which is formed in a chip outside area, arranged outside than the MEMS chip, the pressure regulation film has a slit. The slit is arranged in the neighborhood of the vent and the vent is covered with the pressure regulation film.

26 Claims, 33 Drawing Sheets

(56) References Cited

U.S. PATENT DOCUMENTS

| | | | | |
|---|---|---|---|---|
| 2009/0001553 A1* | 1/2009 | Pahl | ............... | B81B 7/0064 |
| | | | | 438/126 |
| 2013/0001765 A1* | 1/2013 | Yaralioglu | ............ | B81C 1/0069 |
| | | | | 257/E23.081 |
| 2013/0140656 A1* | 6/2013 | Pahl | ............... | H04R 29/004 |
| | | | | 257/416 |
| 2014/0239428 A1* | 8/2014 | Pueschner | ........ | G06K 19/07728 |
| | | | | 257/773 |
| 2020/0329299 A1* | 10/2020 | Miller | ............... | H04R 19/005 |
| 2021/0013116 A1* | 1/2021 | Koduri | ............... | B81B 7/0093 |
| 2021/0029471 A1* | 1/2021 | Klose | ............... | H04R 19/04 |
| 2021/0171338 A1* | 6/2021 | Davis | ............... | H04R 19/04 |
| 2021/0323812 A1* | 10/2021 | Schaller | ............ | B81B 7/0048 |
| 2022/0020659 A1* | 1/2022 | Zheng | ............... | H01L 21/56 |

FOREIGN PATENT DOCUMENTS

| | | | |
|---|---|---|---|
| JP | 201512605 A | 1/2015 | |
| JP | 2015530790 A | 10/2015 | |
| JP | 2015532038 A | 11/2015 | |
| JP | 201672959 A | 5/2016 | |
| JP | 2016523725 A | 8/2016 | |
| JP | 2017522814 A | 8/2017 | |
| JP | 6445158 B2 | 12/2018 | |

\* cited by examiner (a)

(b)

MEMS PACKAGE, MEMS MICROPHONE AND METHOD OF MANUFACTURING THE MEMS PACKAGE

BACKGROUND

Field of the Invention

The present invention relates to a MEMS package which a MEMS chip, being used as a microphone, a sensor and so on, is mounted on a package substrate, a MEMS microphone having the MEMS package and method of manufacturing the MEMS package.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound wave, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding, for example see JP2016-523725 (also called patent document 1)), and the other is a structure which the MEMS chip is mounted on the package substrate by a Wire Bonding (for example, see JP2012-114672 (also called patent document 2)).

SUMMARY OF THE INVENTION

By the way, in case of the MEMS package which is used as the microphone, it is important that the sound wave, entered from outside, reaches the membrane. As the structure for the-above, the structure, which sound holes are formed on both the package substrate and motherboard (also called a bottom-port structure), is conventionally known (for example, see JP2017-522814 (also called patent document 3)).

However, when the MEMS package is used as the microphone, a loud sound or a large wind pressure sometimes enter inside suddenly from outside, through the sound hole. In such a case, air enter intensely inside of the device such as the microphone or the like through the sound hole. Therefore, atmospheric pressure of the inside of the device rises suddenly. As the result, the membrane is likely to be damaged.

Then, the MEMS device, having the structure which the pressure of the inside of the device was attenuated by movable parts such as a valve or the like, is conventionally known (for example, see JP6445158 (also called patent document 4), JP2015-532038 (also called patent document 5). Further, the MEMS device, having a sensing film including a stress release structure, is also conventionally known (for example, see JP5422189 (also called patent document 6)). The stress release structure is a structure which a stress is released by a physical deformation such as a stretch or the like.

As illustrated in FIG. 32, in case of the above-described conventional MEMS device 500, disclosed in the patent document 4, the movable structure part 503, having the movable part 501 and the spacer 502, is arranged between the outside of the MEMS device 500 and the diaphragm 504. Therefore, when the sound wave enters from the outside of the MEMS device 500 through the sound hole 505, the sound wave is attenuated by the movable part 501. Then, the sound wave, which should be detected, is also attenuated by the movable part 501. Therefore, because it becomes difficult that the sound wave is detected by the diaphragm 504, sensitivity of the MEMS device 500 is lowered.

Further, in case of the above-described conventional MEMS devices, disclosed in the patent documents 5, 6, the movable parts such as a valve or the like and the stress release structure are provided on the membrane or a film member. For example, the membrane 603 is formed on the base part 602, having the concave part 601, and the valve flap 604, which is movable in accordance with the pressure, is formed in the membrane 603, as the MEMS device 600 illustrated in FIG. 33.

In case of the MEMS device 600, the valve flap 604 moves in accordance with the pressure. Then, when the sound pressure, which should be detected, operates the membrane 603, the pressure, which operates to the membrane 603, is also attenuated. Then, in case of the MEMS device 600, it becomes difficult that the change of slight sound wave is detected by the membrane 603. Therefore, sensitivity of the MEMS device 600 is also lowered.

On the other hand, in case of the MEMS package, which is used as the microphone, the structure, which the sound hole is formed in a cap (also called a lid-part, a case, a housing) for accommodating the MEMS package (also called a top-port structure), is also conventionally known (for example, see JP2015-530790 (also called patent document 7), JP2016-72959 (also called patent document 8), JP2015-12605 (also called patent document 9)).

Then, in case of the MEMS package, having the top-port structure, the membrane is likely to be damaged, when a loud sound or a large wind pressure enter inside suddenly through the sound hole, similar with the above-described MEMS device, having the bottom-port structure.

As described-above, it is difficult to prevent a breakage of the membrane and the film member without lowering sensitivity, in the conventional MEMS device having a pressure regulation part by the movable part such as a valve or the like and the stress release structure.

Hence the present invention is made to solve the above problem, and it is an object to provide the MEMS package and the MEMS microphone, which is able to prevent a breakage of the membrane and the film member, without lowering sensitivity, and method of manufacturing the MEMS package, in the case which the pressure regulation part, by the movable part such as a valve or the like and the stress release structure, are provided.

To solve the above problem, the present invention is a MEMS package including: a MEMS chip; a package substrate which the MEMS chip is adhered; a chip cover which is adhered to the package substrate and which wraps the MEMS chip; and a pressure regulation film which is adhered to the front surface of the chip cover; the chip cover has a vent which is formed in a chip outside area, arranged outside than the MEMS chip, the pressure regulation film has a slit, the slit is arranged in the neighborhood of the vent and the vent is covered with the pressure regulation film.

In case of the above-described MEMS package, it is possible that the MEMS package, further including: an ASIC package which is adhered to the package substrate; the chip cover wraps the ASIC package together with the MEMS chip, the vent is arranged in a middle area, of the chip outside area, between the MEMS chip and the ASIC package.

Further, it is preferable that the pressure regulation film has a two-slits structure including a first slit and a second slit, as the slit.

Furthermore, it is preferable that the first slit and the second slit are formed outside the vent so as to oppose to each other via the vent.

Further, it is possible that the pressure regulation film has a transformable part, which is transformed with air stream passing through the vent, arranged between the first slit and the second slit.

Further, it is possible that the pressure regulation film is formed in a rectangular shape so as to struggle the MEMS chip and the ASIC package, the slit is formed along with the long side of the pressure regulation film.

Further, it is preferable that the pressure regulation film is formed in a rectangular shape so as to struggle the MEMS chip and the ASIC package, and end parts of the both sides along with the long side, are respectively adhered to a chip area of the chip cover, arranged on the MEMS chip, and a package area of the chip cover, arranged on the ASIC package.

Further, it is preferable that the MEMS chip is mounted on the package substrate by a FCB, the chip cover is formed so as to be in contact with a chip surface, being the outer surface of the MEMS chip, and the side surface of the MEMS chip.

Further, it is preferable that the MEMS package according to claim 1, further including: a sealed structure which the chip cover seals the MEMS chip and the ASIC package, and the pressure regulation film covers the vent; the sealed structure forms a front chamber.

It is preferable that the pressure regulation film is made of rubber material having flexibility or resin material having flexibility.

Further, the present invention provides a MEMS package including: a MEMS chip; a package substrate which the MEMS chip is adhered; a chip cover which is adhered to the package substrate and which wraps the MEMS chip; and a pressure regulation film which is adhered to the front surface of the chip cover; the chip cover has a vent which is formed in a chip outside area, arranged outside than the MEMS chip, the pressure regulation film has a cut-line, the cut-line is arranged in the neighborhood of the vent and the vent is covered with the pressure regulation film.

Further, it is preferable that the pressure regulation film has a two-lines structure including a first cut-line and a second cut-line, as the cut-line.

It is preferable that the first cut-line and the second cut-line are formed along with a slanting direction, which forms an acute angle or an obtuse angle with a surface of the pressure regulation film.

Further, it is possible that the MEMS chip includes an element substrate which a movable element is formed, the element substrate includes a hole-part which the movable element is arranged, the chip cover includes a cover hole part formed in accordance with the hole-part.

Further, it is possible that the MEMS package, further including: a back chamber which is surrounded by the chip cover and the package substrate.

Further, the present invention provides a MEMS package including: a MEMS chip; a package substrate which the MEMS chip is adhered; and a chip cover which is adhered to the package substrate and which wraps the MEMS chip; the chip cover has a cut-line which is formed in a chip outside area, arranged outside than the MEMS chip, the cut-line is formed in a middle area, of the chip outside area, between the MEMS chip and the ASIC package.

In case of the above-described MEMS package, it is possible that the cut-line is formed in a s-figure in a plan view or in a meandering figure connecting a plurality of s-figures in a plan view.

Further, in case of the above-described MEMS package, it is preferable that the cut-line is formed along with a slanting direction, which forms an acute angle or an obtuse angle with a surface of the chip cover.

Further, the present invention provides a MEMS microphone including: a MEMS package; and a cap which wraps the MEMS package; the MEMS package includes a MEMS chip, a package substrate which the MEMS chip is adhered, a chip cover which is adhered to the package substrate and which wraps the MEMS chip, and a pressure regulation film which is adhered to the front surface of the chip cover; the chip cover has a vent which is formed in a chip outside area, arranged outside than the MEMS chip; the pressure regulation film has a slit; the slit is arranged in the neighborhood of the vent and the vent is covered with the pressure regulation film.

In case of the above-described MEMS microphone, it is possible that the cap includes a top-surface, which is formed so as to oppose to the package substrate, and a cap-side-surface, which surrounds the top-surface and adhered to the package substrate, the MEMS microphone further comprising a back chamber which is formed between the top-surface, the cap-side-surface of the cap and the chip cover, the pressure regulation film.

Further, it is possible that the MEMS microphone, further including: a front chamber which is surrounded by the chip cover, the pressure regulation film and the package substrate.

Further, it is possible that the MEMS chip includes an element substrate which a movable element is formed, the element substrate includes a hole-part which the movable element is arranged, the chip cover includes a cover hole part formed in accordance with the hole-part.

Further, it is preferable that the MEMS microphone, further including: a back chamber which is surrounded by the chip cover, the pressure regulation film and the package substrate.

Further, the present invention provides a method of manufacturing a MEMS package, using a MEMS chip, an ASIC and a package substrate including: a mounting step for mounting the MEMS chip and the ASIC, by a FCB, on each of package regions of a package-panel which a plurality of package regions, for manufacturing the package substrate, are formed; a cover member forming step for forming a cover member which wraps the MEMS chip and the ASIC with a heat-resistant adhesive sheet, being applied on the surface of the package-panel, by performing vacuum lamination; a chip cover forming step for forming a chip cover by forming a vent in a part, of the cover member, arranged between the MEMS chip and the ASIC; and a pressure regulation film forming step for forming a pressure regulation film by arranging a slit-formed film, which a slit is formed, in the neighborhood of the vent, and being adhered to the front surface of the chip cover so as to cover the vent.

Furthermore, it is possible that the MEMS chip includes an element substrate which a movable element is formed, the element substrate comprises a hole-part which the movable element is arranged, the method of manufacturing a MEMS package further including: a cover hole part forming step for forming a cover hole part by removing a part, of the chip cover, corresponding to the hole-part.

Further, it is possible that the chip cover forming step is performed so that the package-panel is heated to harden the heat-resistant adhesive sheet.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the MEMS Package, MEMS Microphone)

To begin with, the structure of the MEMS package 1, MEMS microphone 100, according to the embodiment of the present invention will be explained with reference to FIG. 1 to FIG. 7.

Figure 1:
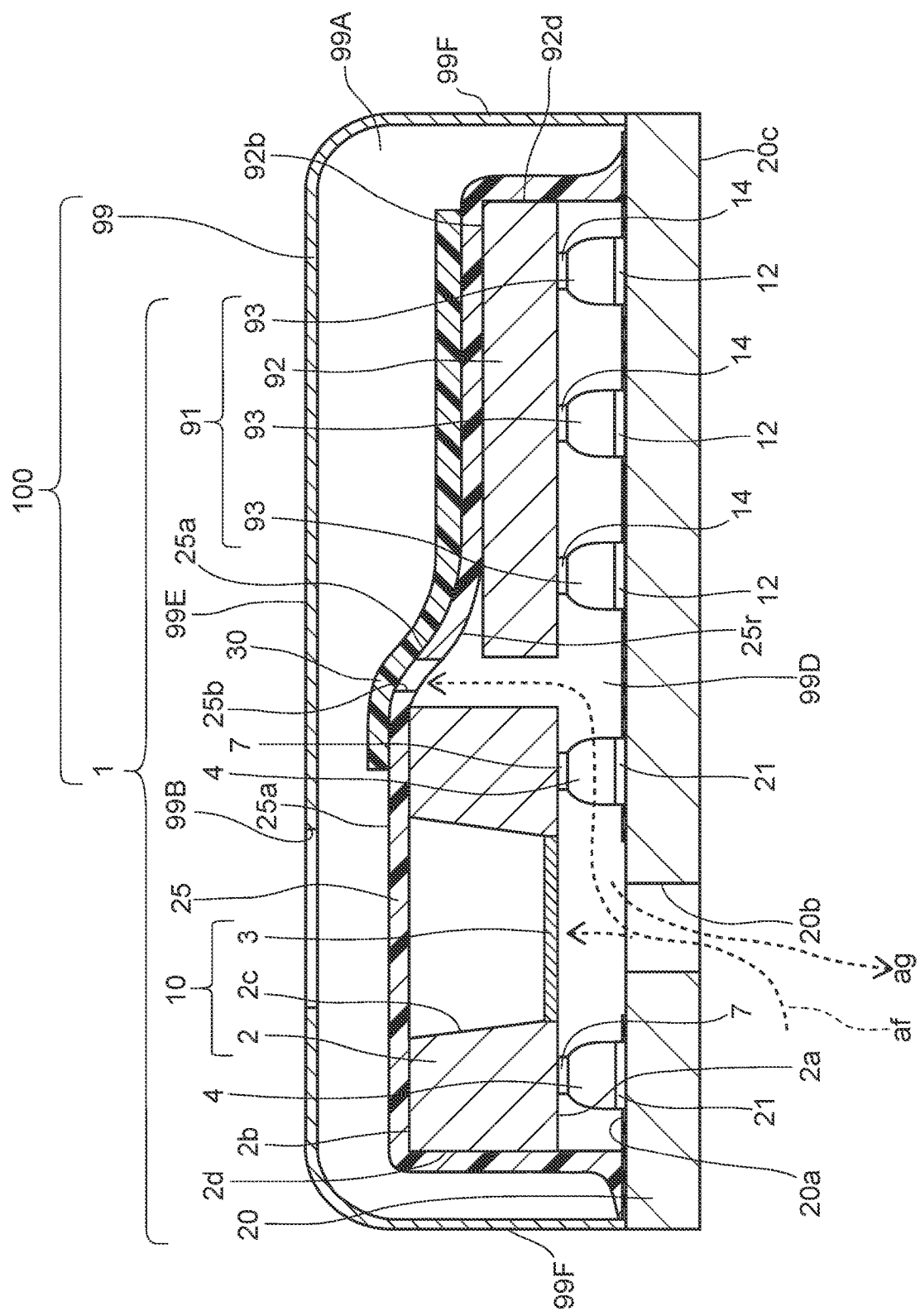
FIG. 1 is a sectional view, of a part corresponding to the line 1-1 in FIG. 2, showing the MEMS microphone having the MEMS package according to the embodiment of the present invention.
Figure 2:
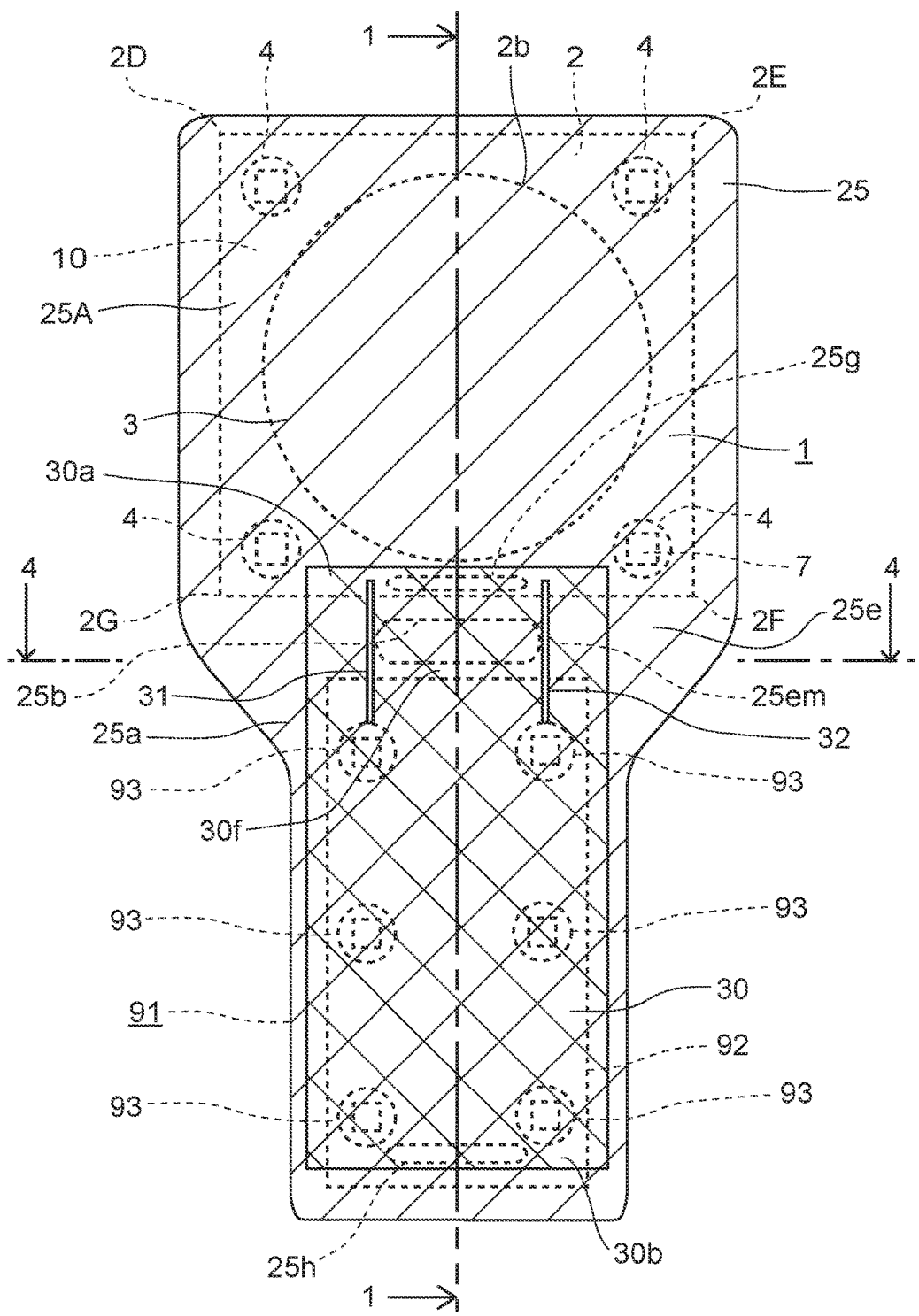
FIG. 2 is a plan view showing a principal part of the MEMS package.
Figure 3:
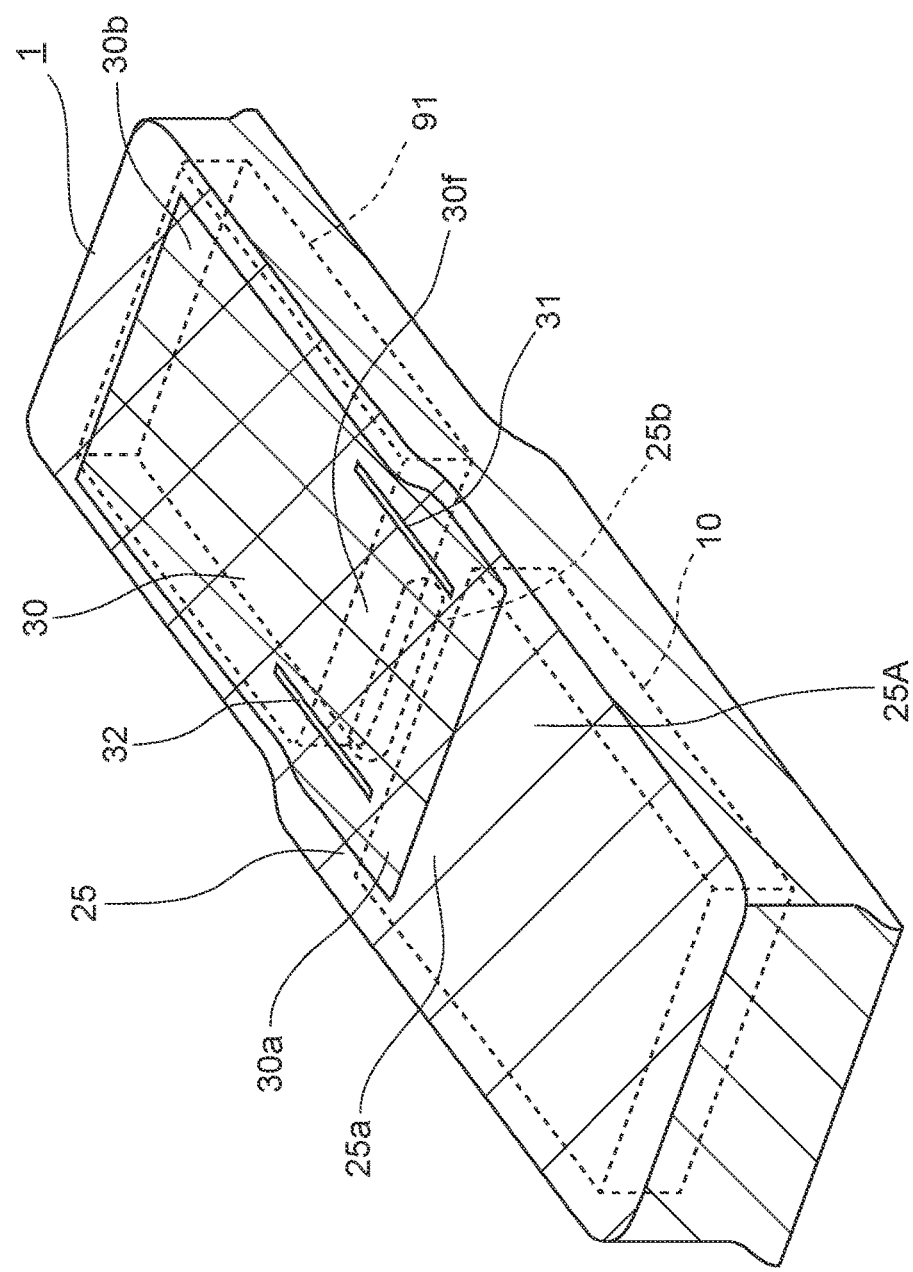
FIG. 3 is a perspective view showing the MEMS package.
Figure 4:
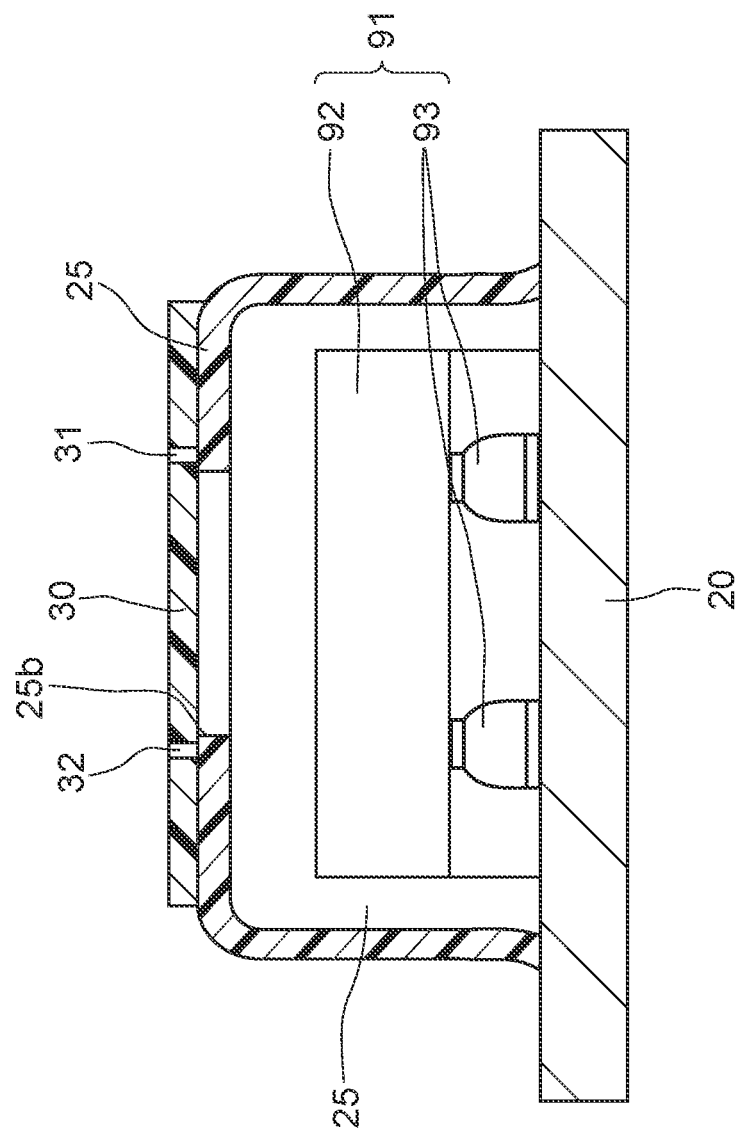
FIG. 4 is a sectional view of a part corresponding to the line 4-4 in FIG. 2.
Figure 5:
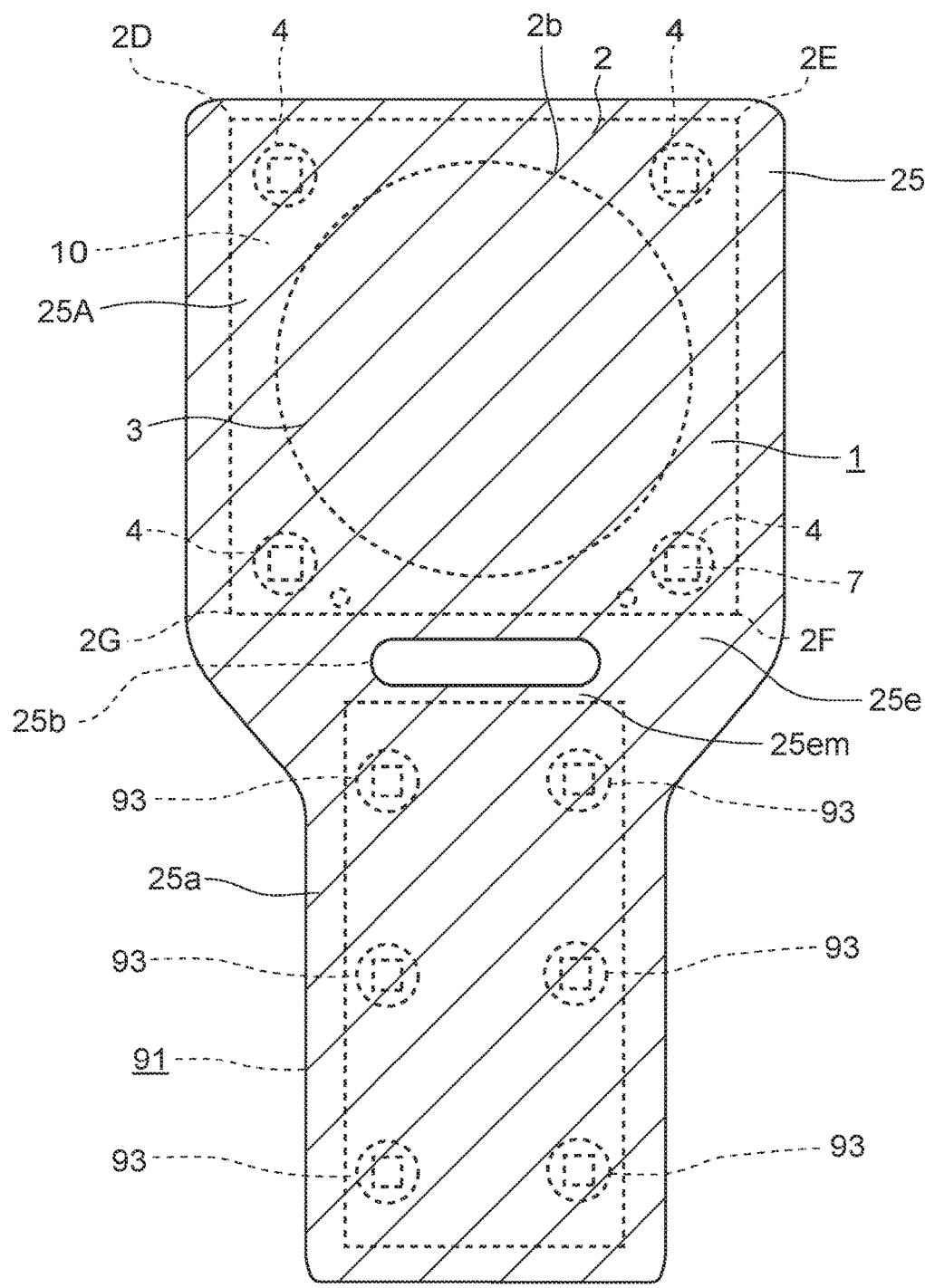
FIG. 5 is a plan view, corresponding to FIG. 2, showing the MEMS package which before a pressure regulation film is formed.
Figure 6:
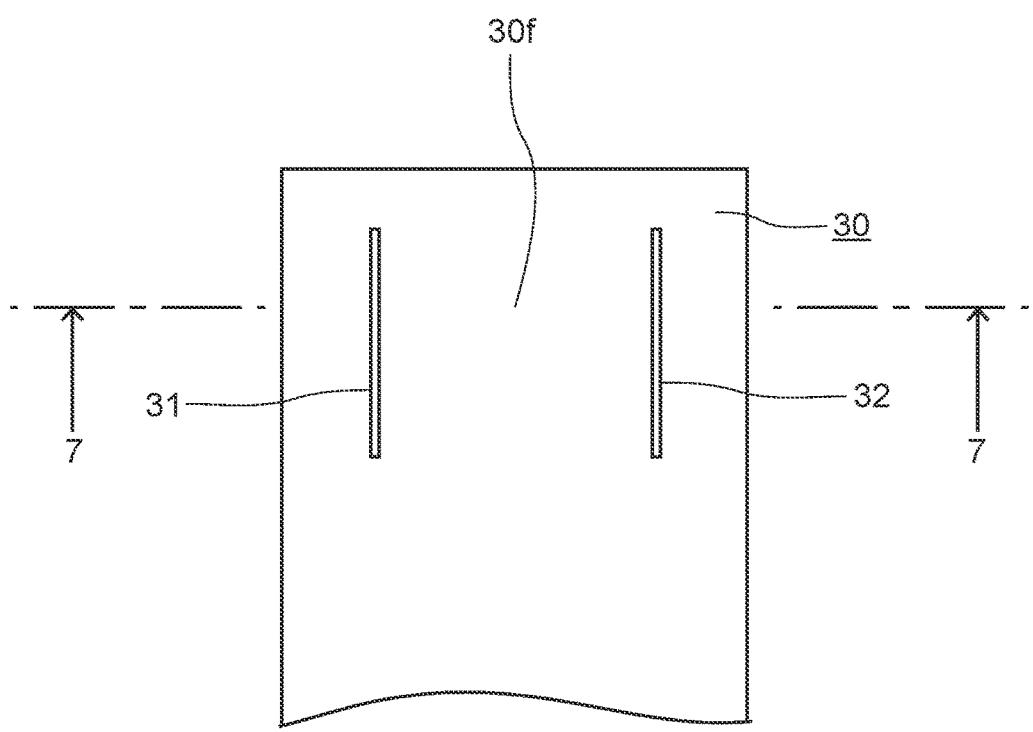
FIG. 6 is a plan view, partially omitted, showing the pressure regulation film.
Figure 7:
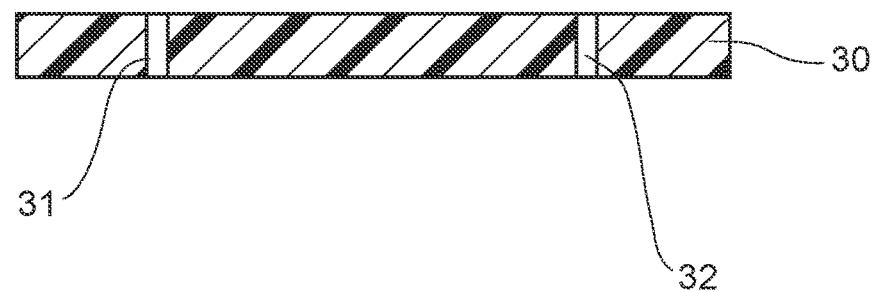
FIG. 7 is a sectional view of a part corresponding to the line 7-7 in FIG. 6.
Figure 8:
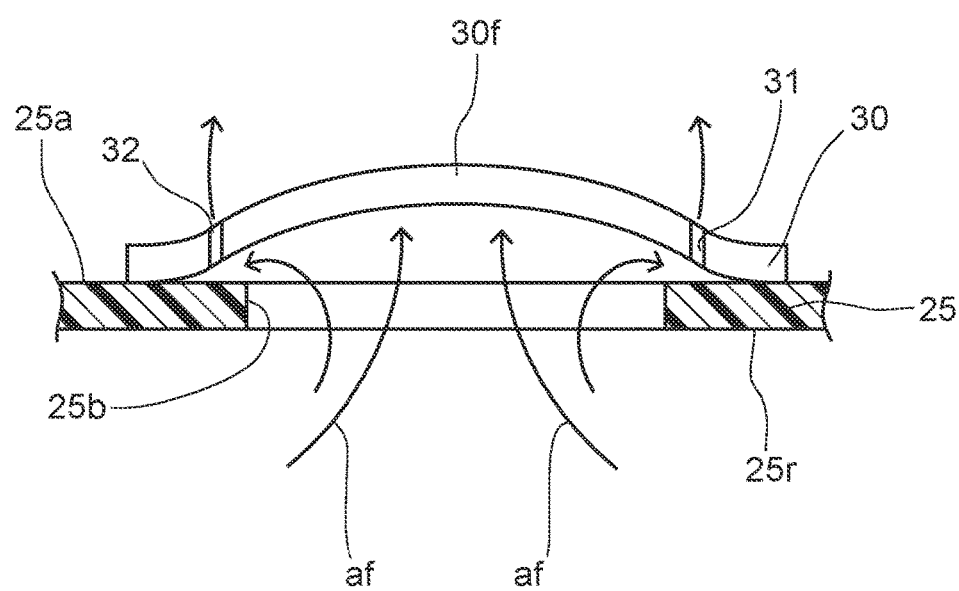
FIG. 8 is a sectional view showing the principal parts of the pressure regulation film, transformed in an upward curving shape, and a chip cover.

Here, FIG. 1 is a sectional view, of a part corresponding to the line 1-1 in FIG. 2, showing the MEMS microphone 100 having the MEMS package 1 according to the embodiment. FIG. 2 is a plan view showing a principal part of the MEMS package 1. FIG. 3 is a perspective view showing the MEMS package 1. FIG. 4 is a sectional view of a part corresponding to the line 4-4 in FIG. 2. FIG. 5 is a plan view, corresponding to FIG. 2, showing the MEMS package 1 which before a pressure regulation film 30 is formed. FIG. 6 is a plan view, partially omitted, showing the pressure regulation film 30. FIG. 7 is a sectional view of a part corresponding to the line 7-7 in FIG. 6.

As illustrated in FIG. 1, the MEMS microphone 100 has the MEMS package 1 and a cap 99.

The MEMS package 1 has the MEMS chip 10, the package substrate 20, which the MEMS chip 10 is adhered, bonding bumps 4, a chip cover 25, the pressure regulation film 30 and an ASIC (Application Specific Integrated Circuit) package 91. In case of the MEMS package 1, the MEMS chip 10 and an ASIC 92 of an ASIC package 91 are mounted on the package substrate 20 by the FCB. Because in the package substrate 20, a sound hole 20b is formed, the MEMS package 1 has the bottom-port structure.

The MEMS chip 10 has an element substrate 2 which the membrane 3, as a movable element, is formed. The MEMS chip 10 is used as the microphone of capacitance-type. The element substrate 2 is a substrate formed in a rectangular-shape in a plan view, as illustrated in FIG. 2, and it is formed with silicon. A hole-part 2c is formed in the center of the element substrate 2. The hole-part 2c is formed in a cylindrical-shape from a chip-surface 2b (outside surface of the element substrate 2) of the element substrate 2 to an opposing surface 2a (the surface of the element substrate 2, opposing to the package substrate 20), and the membrane 3 is arranged in the opposing surface 2a side of the hole-part 2c. Note that two thin-films, which are called back-plates (not illustrated), are arranged in the upper side and the lower side of the membrane 3.

The membrane 3 is vibration film formed approximately in a circular-shape, and it is a thin-film made of an inorganic metal such as $SiO_2$, $SiN$ or the like.

The bonding bumps 4 are solder bumps made of solder. The four bonding bumps 4 are formed in the MEMS package 1.

As illustrated in FIG. 1, the bonding bumps 4 are adhered to both the MEMS chip 10 and the package substrate 20. Namely, the bonding bumps 4 are adhered respectively to electrode pads 7, formed in the opposing surface 2a, and electrode pads 21, formed in a package surface 20a (surface of the MEMS chip 10 side of the package substrate 20) of the package substrate 20. The respective bonding bumps 4 connect the MEMS chip 10 electrically and fixedly to the package substrate 20.

The chip cover 25 is a thin-film like member which wraps both the MEMS chip 10 and the ASIC 92. For example, the chip cover 25 is formed using high heat-resistant adhesive sheet with epoxy resin.

The chip cover 25 contacts directly to a side surface 2d and the chip-surface 2b of the element substrate 2, and it also contacts directly to a chip-surface 92b and a side surface 92d of the ASIC 92. Further, the peripheral part of the chip cover 25 is adhered to the package substrate 20.

The chip cover 25 has a vent 25b. The vent 25b is a through hole having an approximately rectangular shape in a plan view, as illustrated in FIG. 2, FIG. 5. The vent 25b penetrates the chip cover 25 from the front surface 25a (the cap 99 side) to the rear surface 25r (the package substrate 20 side).

The vent 25b is formed in a chip outside area 25e of the chip cover 25. The chip outside area 25e is a part, of the chip cover 25, arranged outside than the MEMS chip 10. The vent 25b is formed in a part (a middle area 25em), of the chip outside area 25e, between the MEMS chip 10 and the ASIC package 91 (ASIC 92).

The pressure regulation film 30 is made of rubber material having flexibility or resin material (for example, such as polyamide, polyimide or the like) having flexibility, and it is a thin-film like member, formed in a rectangular shape. The pressure regulation film 30 is adhered on the front surface 25a of the chip cover 25. The pressure regulation film 30 covers the vent 25b, and it is formed so as to struggle the MEMS chip 10 and the ASIC package 91 (ASIC 92).

As illustrated in FIG. 2, end parts 30a, 30b, of the both sides of the pressure regulation film 30 along with the long side direction, are respectively adhered, with adhesive, to a chip area 25g, a package area 25h of the chip cover 25. Parts of the pressure regulation film 30, except for the end parts 30a, 30b, are free ends, being not adhered to the chip cover 25. The chip area 25g is a part, of the chip cover 25, being arranged on the MEMS chip 10. The package area 25h is a part, of the chip cover 25, being arranged on the ASIC package 91 (part at the side distant from the MEMS chip 10).

As illustrated in FIG. 6, the pressure regulation film 30 has a first slit 31, a second slit 32. The pressure regulation film 30 has a two-slits structure including the first slit 31 and the second slit 32.

The first, second slits 31, 32 are formed in straight lines having a length which reach the MEMS chip 10 from the ASIC package 91. Further, as illustrated in FIG. 6, the first, second slits 31, 32 are formed along with the long side of the pressure regulation film 30.

As illustrated in FIG. 2, FIG. 3, the first, second slits 31, 32 are formed in the neighborhood of the vent 25b. The first, second slits 31, 32 are formed outside the vent 25b, and they are formed so as to oppose to each other via the vent 25b. Further, the vent 25b is covered with the pressure regulation film 30.

The pressure regulation film 30 has a transformable part 30f, arranged between the first slit 31 and the second slit 32. The transformable part 30f is a part which is transformed in accordance with air stream, passing through the vent 25b.

Then, the MEMS package 1 has a sealed structure. The sealed structure is a structure which the chip cover 25 seals the MEMS chip 10 and the ASIC package 91, and the pressure regulation film 30 covers the vent 25b. A front chamber 99D is formed by the sealed structure.

The ASIC package 91 has the ASIC 92 and the bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The package substrate 20 is a board like member made of such as silicon, ceramic or the like (or PCB: Printed Circuit Board). The electrode pads 21 and electrode pads 12 are formed on the package surface 20a of the package substrate 20. The MEMS package 1 is mounted on the part, of the package surface 20a, which the electrode pads 21 are formed, the ASIC package 91 is mounted on the part which the electrode pads 12 are formed. The package substrate 20 has a sound hole 20b.

Then, as illustrated in FIG. 1 in detail, a first closed-space, surrounded by the chip cover 25, the pressure regulation film 30 and the package substrate 20, is formed in the MEMS package 1. The first closed-space is a space which arranged inside more than the chip cover 25. Further, because the first closed-space is arranged front side of the membrane 3, it corresponds to the front chamber 99D. The ASIC package 91 is arranged inside the chip cover 25 in the back chamber 99D.

The cap 99 covers the MEMS package 1. The cap 99 is adhered to the package surface 20a with not illustrated adhesive (or by soldering).

There is an inner-volume inside of the cap 99, and the MEMS chip 10 of the MEMS package 1 and the ASIC 92 are accommodated in the inner-volume.

The cap 99 has a top-surface 99E and a cap-side-surface 99F. The top-surface 99E is a part which is formed so as to oppose to the package substrate 20. The cap-side-surface 99F is a part which is formed on the peripheral part of the top-surface 99E. The cap-side-surface 99F surrounds the top-surface 99E, and it is adhered to the package substrate 20.

Then, a second closed-space, surrounded by the top-surface 99E and the cap-side-surface 99F of the cap 99, the chip cover 25 and the pressure regulation film 30, is formed in the MEMS microphone 100. The second closed-space is a space which arranged inside more than the cap 99, and it is a space which arranged outside more than the chip cover 25 and the pressure regulation film 30. Because the second closed-space is arranged rear side of the membrane 3, it corresponds to a back chamber 99A.

(Method of Manufacturing the MEMS Package, MEMS Microphone)

Figure 14:
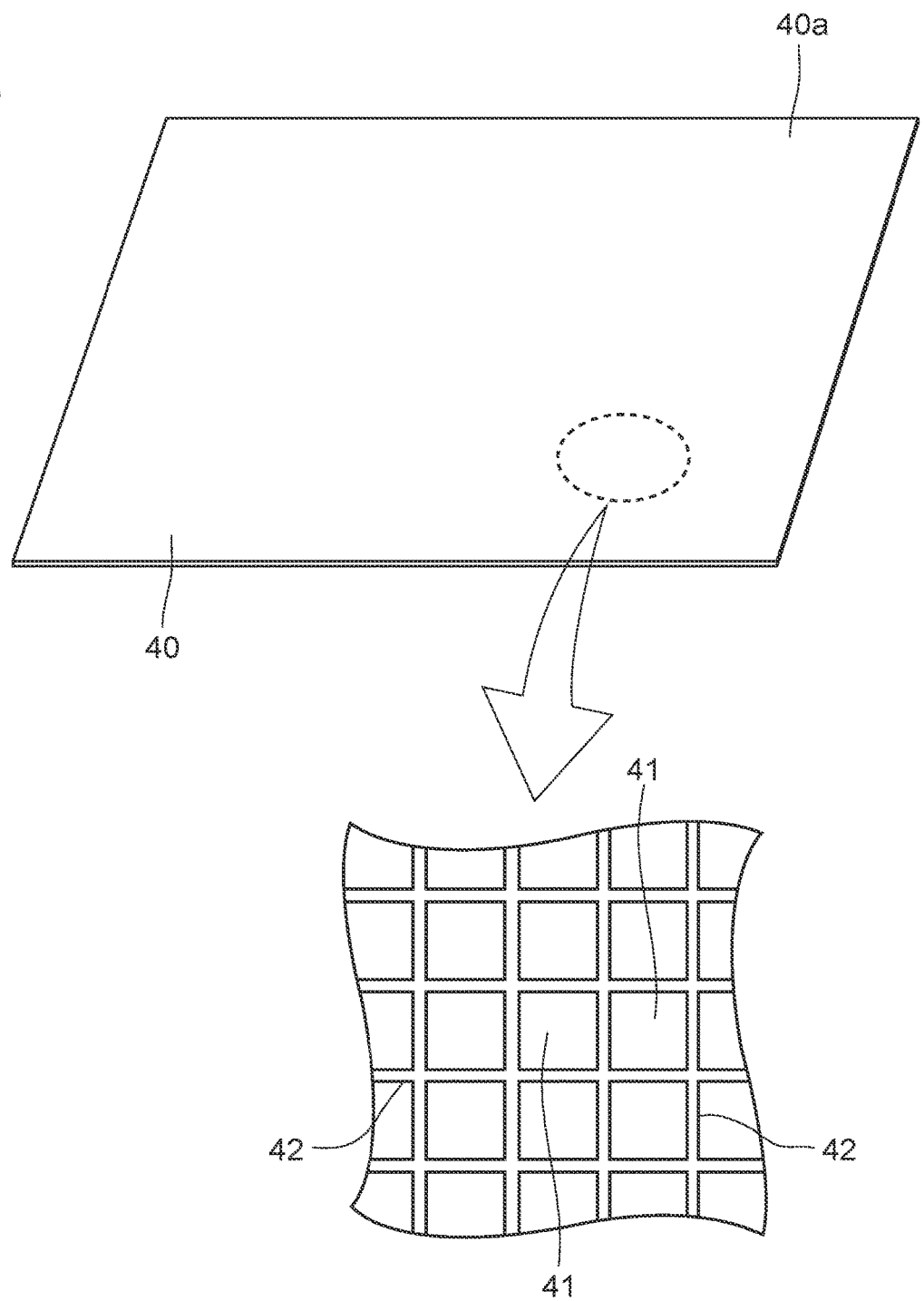
FIG. 14 is a perspective view showing a package-panel, used for manufacturing the MEMS package and the MEMS microphone, according to the embodiment of the present invention.

Subsequently, the method of manufacturing the MEMS package 1 and the MEMS microphone 100, having the above-described structure, will be explained with reference to FIG. 14 to FIG. 18. Here, FIG. 14 is a perspective view showing the later-described package-panel 40, FIG. 15 to FIG. 18 are sectional views showing the manufacturing step of MEMS package 1.

In the method of manufacturing the MEMS package 1, the MEMS package 1 is manufactured using the above-mentioned MEMS chip 10, the ASIC 92 and the package substrate 20. In case of the method of manufacturing according to the embodiment, the MEMS chip 10 (rectangular MEMS chip), having the rectangular element substrate 2, is used. Further, the package-panel 40, illustrated in FIG. 14, is used.

The package-panel 40 is a board-like member, having rectangular shape, made of PCB or ceramic, and a plurality of package-regions 41 are formed on the surface 40a by a uniform arrangement. When the package-panel 40 is divided along with divided lines 42, the package substrate 20 is manufactured from each of package regions 41 (about 600 package substrates 20 are manufactured by every package-panel 40).

A mounting step, a cover member forming step, a chip cover forming step and a pressure regulation film forming step are included in the method of manufacturing the MEMS package 1.

Figure 15:
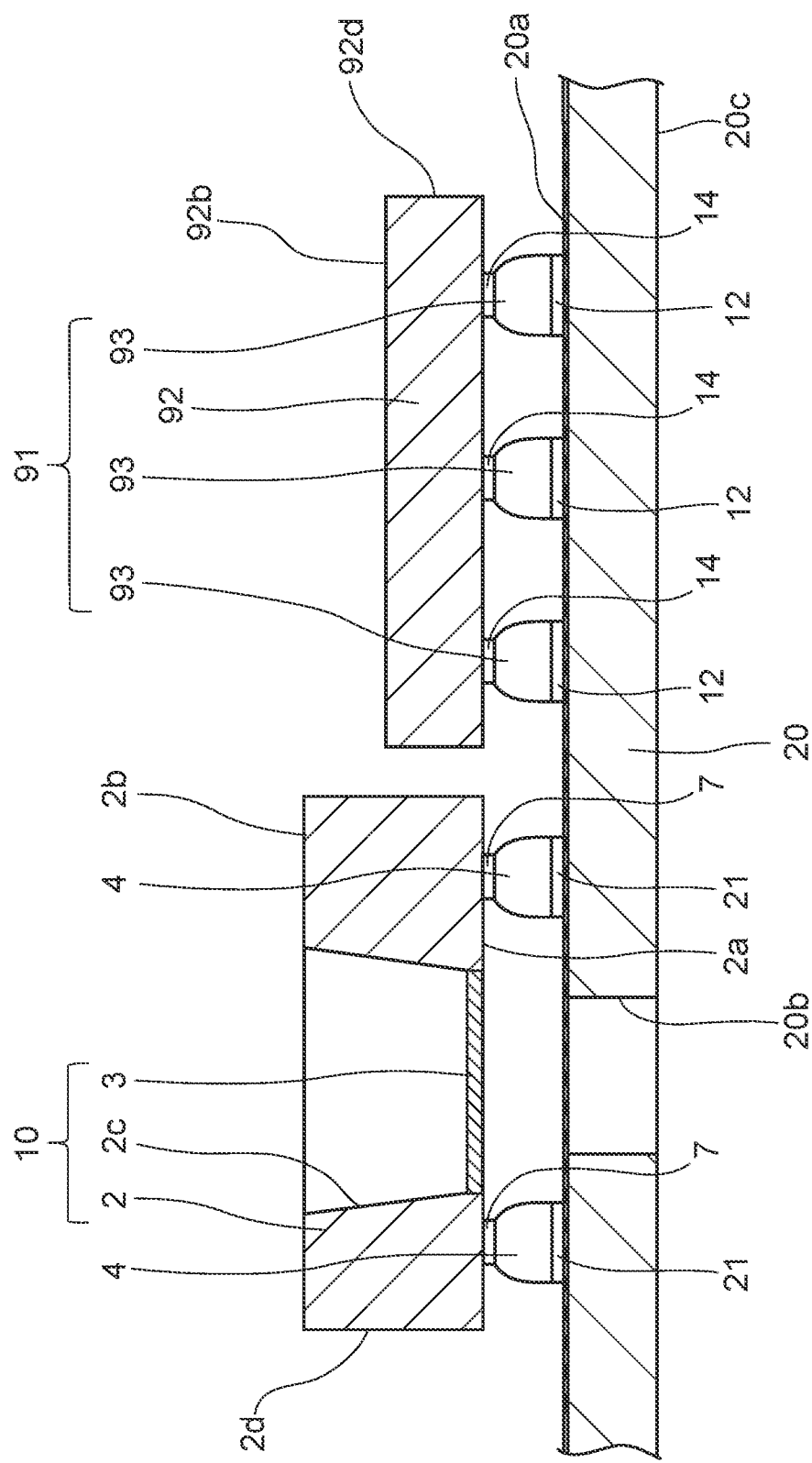
FIG. 15 is a sectional view, corresponding to FIG. 1, showing a manufacturing step of the MEMS package according to the embodiment of the present invention.

In the mounting step, the MEMS chip 10 and the ASIC 92 are mounted in each of the package regions 41 of the package-panel 40. In this case, in the MEMS chip 10, the four bonding bumps 4 are formed in the opposing surface 2a side. In the ASIC 92, bonding bumps 93 are formed. After that, as illustrated in FIG. 15, the MEMS chip 10 and the ASIC 92 is mounted respectively on each of the package regions 41 by the FCB.

Next, the cover member forming step is performed. In the cover member forming step, a vacuum lamination is performed using a not-illustrated vacuum laminator. Then, the surface 40a of the package-panel 40 is covered with the high heat-resistant adhesive sheet with epoxy resin (not-illustrated).

Figure 16:
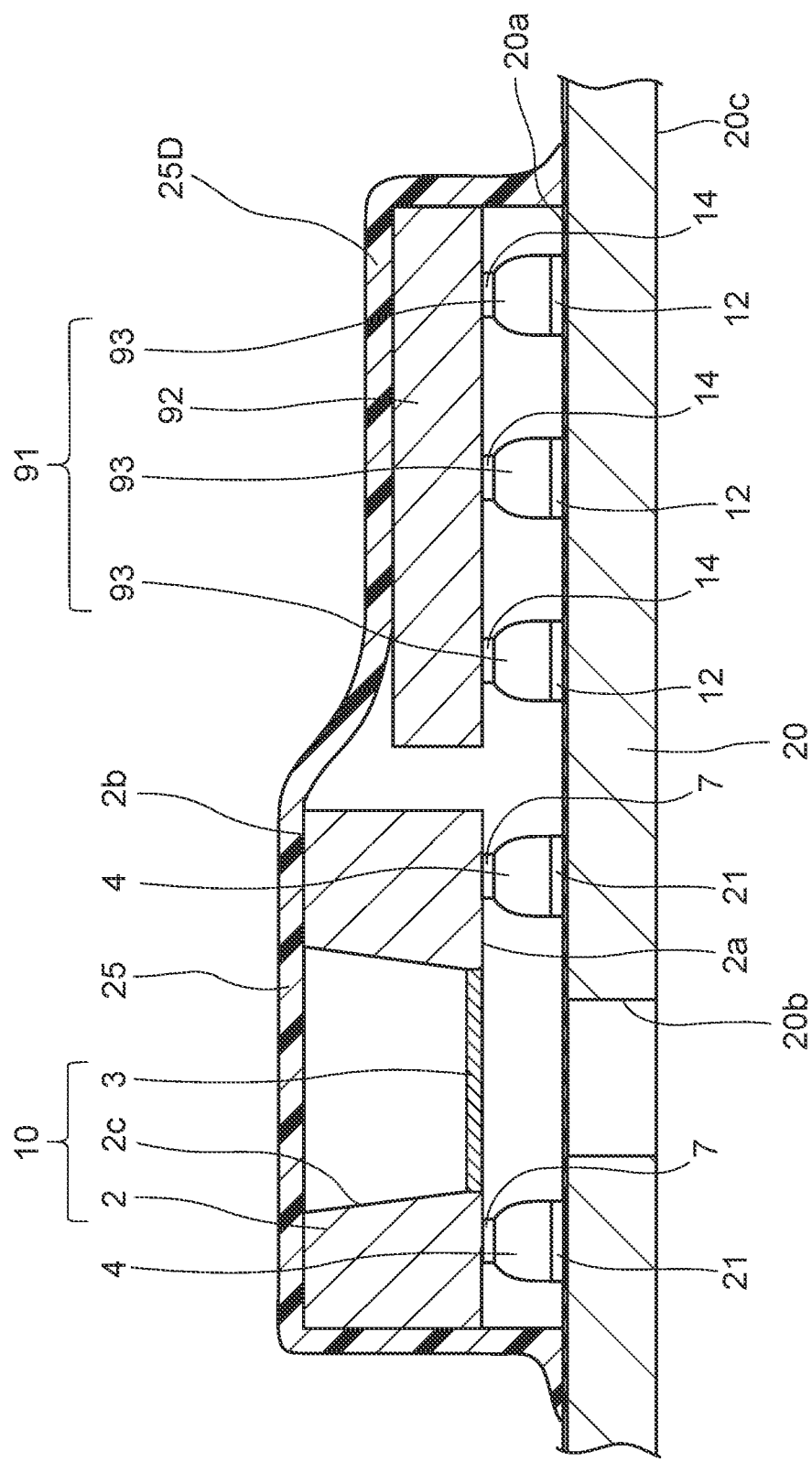
FIG. 16 is a sectional view showing the manufacturing step subsequent to that in FIG. 15.

The mounting step is performed, thereby the MEMS chip 10 and the ASIC 92 are mounted on each of the package regions 41 of the package-panel 40. Therefore, the high heat-resistant adhesive sheet is adhered to the surface of each of the MEMS chips 10 (chip-surface 2b and side surface 2d), and the surface of the ASIC 92 (chip-surface 92b and side surface 92d) without gap. Further, the high heat-resistant adhesive sheet is also adhered to the package surface 20a of the package substrate 20. After that, the package-panel 40 is heated to harden the high heat-resistant adhesive sheet. Thereby, as illustrated in FIG. 16, a cover member 25D is formed. The cover member 25D wraps the MEMS chip 10 and the ASIC 92.

Subsequently, the chip cover forming step is performed. In the chip cover forming step, unnecessary parts of the high heat-resistant adhesive sheet are removed with laser. Further, parts of the high heat-resistant adhesive sheet, arranged between each of the package regions 41, are also removed.

Figure 17:
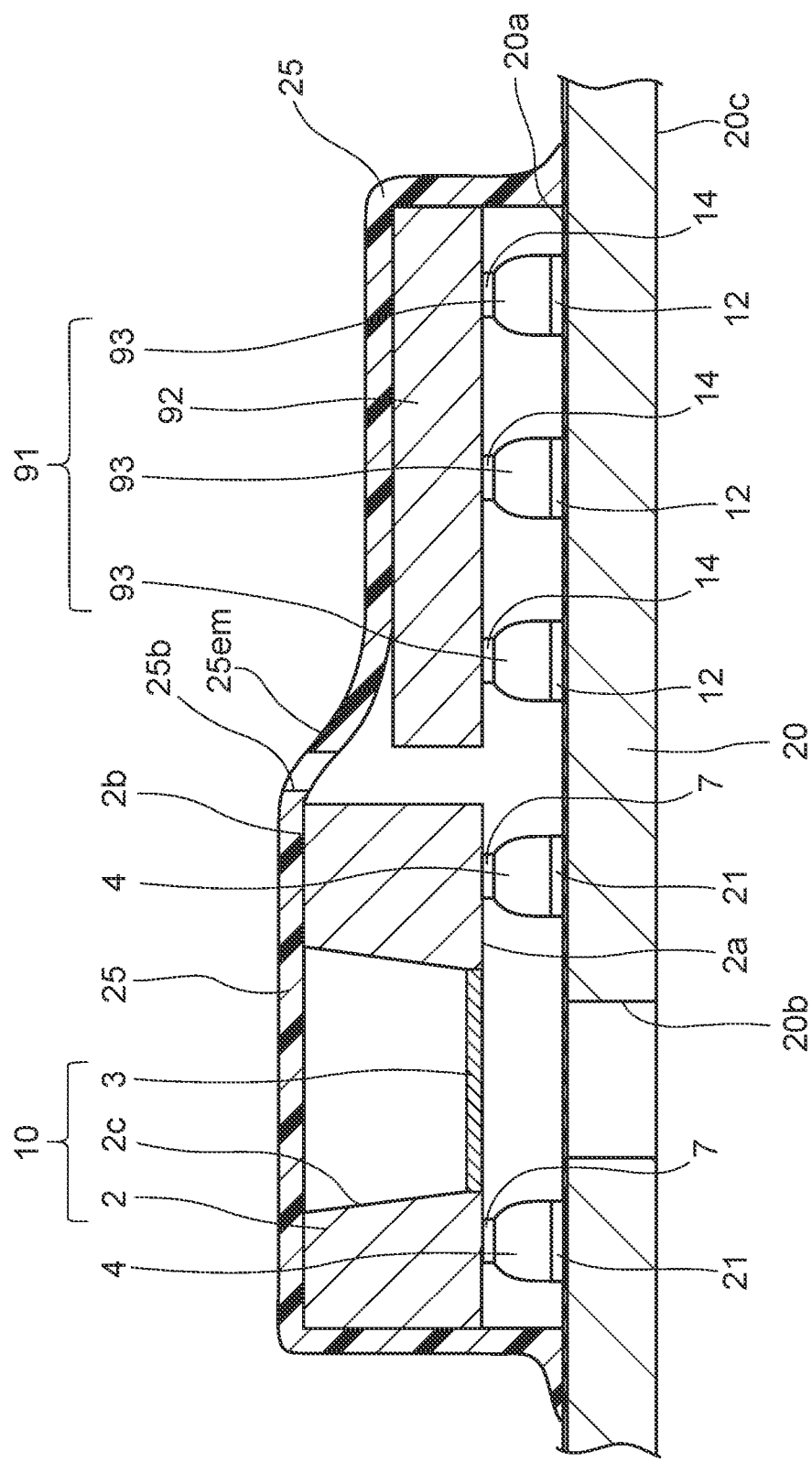
FIG. 17 is a sectional view showing the manufacturing step subsequent to that in FIG. 16.

At the step, as illustrated in FIG. 17, the parts (middle area 25em) of the cover member 25D, between the MEMS chip 10 and the ASIC 92, are partially removed to form the vent 25b. The chip cover forming step is performed, thereby the chip cover 25, having the vent 25b, is formed.

Figure 18:
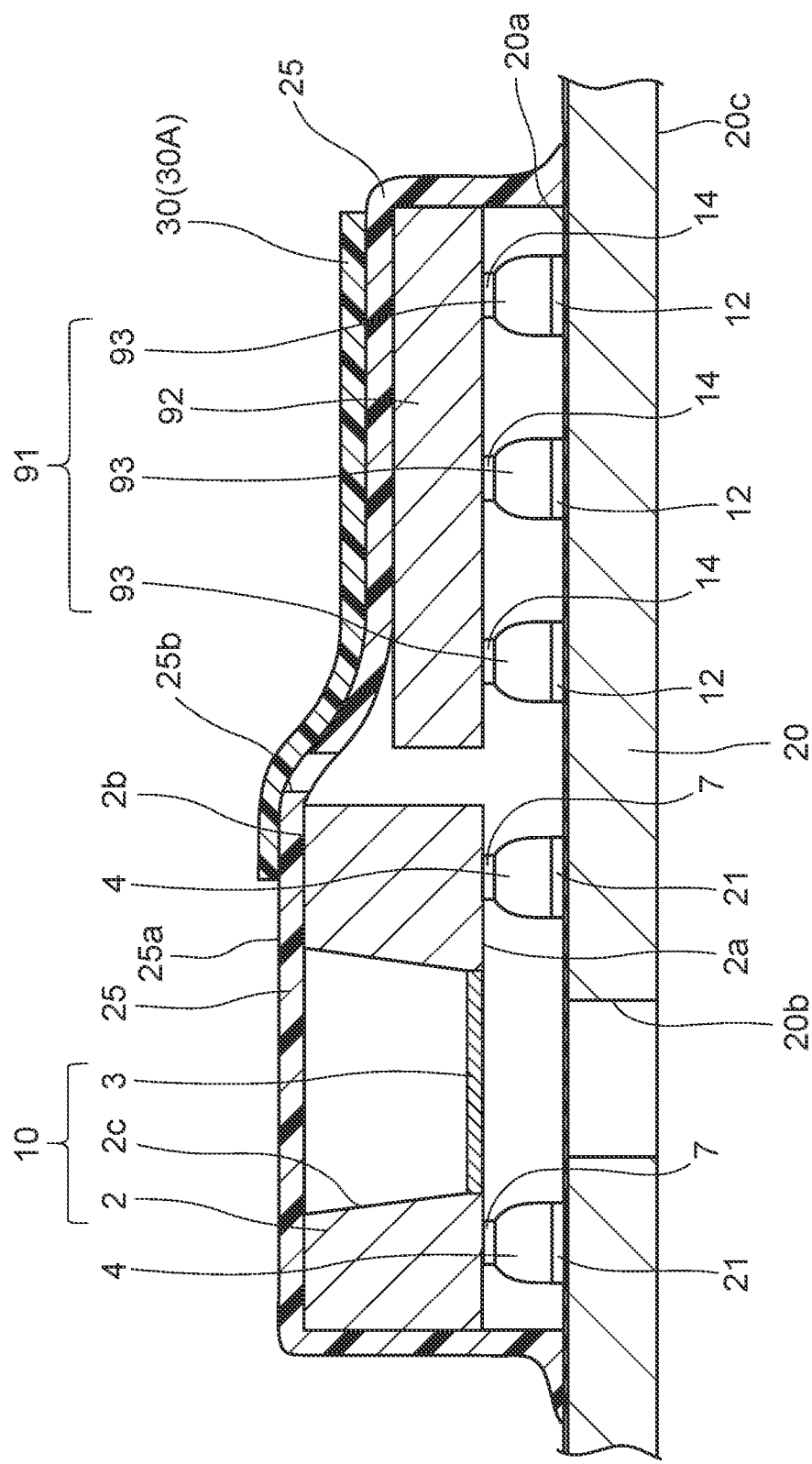
FIG. 18 is a sectional view showing the manufacturing step subsequent to that in FIG. 17.

Next, the pressure regulation film forming step is performed. In the pressure regulation film forming step, a slit-formed film 30A is used. Then, as illustrated in FIG. 18, the slit-formed film 30A is adhered to the front surface 25a of the chip cover 25 with adhesive.

The slit-formed film 30A has the first, second slits 31, 32 and it is formed in a rectangular shape with rubber material or resin material such as polyamide, polyimide or the like. The slit-formed film 30A is adhered to the front surface 25a of the chip cover 25 so that the first, second slits 31, 32 are arranged in the neighborhood of the vent 25b of the chip cover 25, and the vent 25b is covered with the slit-formed film 30A. Thereby the pressure regulation film 30 is formed. When the pressure regulation film 30 is formed, the vent 25b is closed by the pressure regulation film 30 from the front surface 25a side.

More subsequently, each of the package regions 41 of the package-panel 40 is covered with the cap 99.

After that, a panel cutting step is performed. In the panel cutting step, the package-panel 40, which the MEMS chip 10 and the ASIC 92 are mounted, is cut along with the divided lines 42 to be divided into the respective package-regions 41. Then, the package-panel 40 is divided into a plurality of package-regions 41. The MEMS package 1 and the MEMS microphone 100 are manufactured together with the package substrate 20 from each of the package-regions 41.

(Operation and Effect of the MEMS Package)

As mentioned above, the MEMS chip 10 and the ASIC 92 are mounted on the package substrate 20, and the MEMS chip 10 is connected to the ASIC 92 on the package substrate 20, in the MEMS package 1 and the MEMS microphone 100.

In case of the MEMS package 1 and the MEMS microphone 100, the sound wave enters the front chamber 99D through the sound hole 20b. The sound wave directly reaches the membrane 3, thereby the membrane 3 vibrates in accordance with the sound wave.

However, in case of the MEMS package 1 and the MEMS microphone 100, a loud sound or a large wind pressure sometimes enter inside suddenly through the sound hole 20*b*.

Then in this case, as illustrated in FIG. 1, the air stream af, caused by the loud sound or the large wind pressure, reaches the membrane 3. At the same time, the air stream af passes, from the sound hole 20*b*, through between the package substrate 20 and the bonding bumps 4, further it passes through between the MEMS chip 10 and the ASIC 92, it reaches the chip cover 25.

The vent 25*b* is formed on the chip cover 25, the vent 25*b* is arranged in the middle area 25*em* between the MEMS chip 10 and the ASIC 92. Therefore, the air stream af passes the vent 25*b* from the rear surface 25*r* side to the front surface 25*a* side. Besides, because the pressure regulation film 30 is formed so as to cover the vent 25*b*, the air stream af reaches the pressure regulation film 30 after passing through the vent 25*b*.

The pressure regulation film 30 is a thin-film like member made of rubber material or resin material. The pressure regulation film 30 is formed in a rectangular shape. The end parts 30*a*, 30*b* are adhered to the chip cover 25, parts of except for the end parts 30*a*, 30*b* are free ends. Therefore, the transformable part 30*f* of the pressure regulation film 30 is lifted by the air stream af. Then, as illustrated in FIGS. 8-11, the pressure regulation film 30 is transformed in an upward curving shape by the air stream af.

The pressure regulation film 30 has the two-slits structure including the first slit 31 and the second slit 32. The first, second slits 31, 32 are arranged in the neighborhood of the vent 25*b*. Therefore, the first, second slits 31, 32, which the transformable part 30*f* is transformed by the air stream af, are followings.

Figure 9:
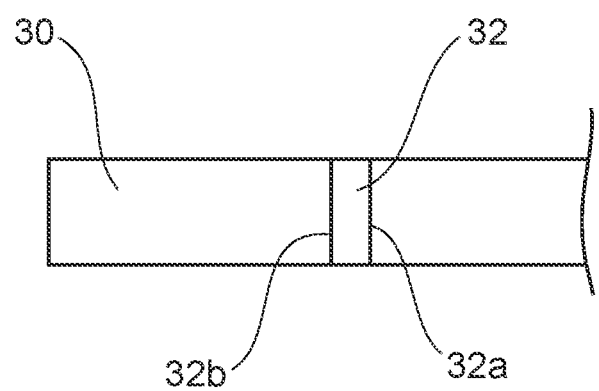
FIG. 9 (a) is a side elevation view showing a part, including a slit, of the pressure regulation film, before transformed in an upward curving shape, FIG. 9 (b) is a side elevation view showing a part, including the slit, of the pressure regulation film when it is transformed in an upward curving shape.
Figure 9:
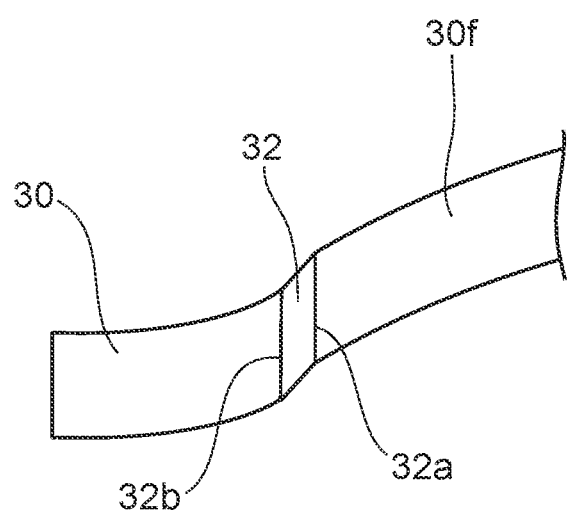
Figure 10:
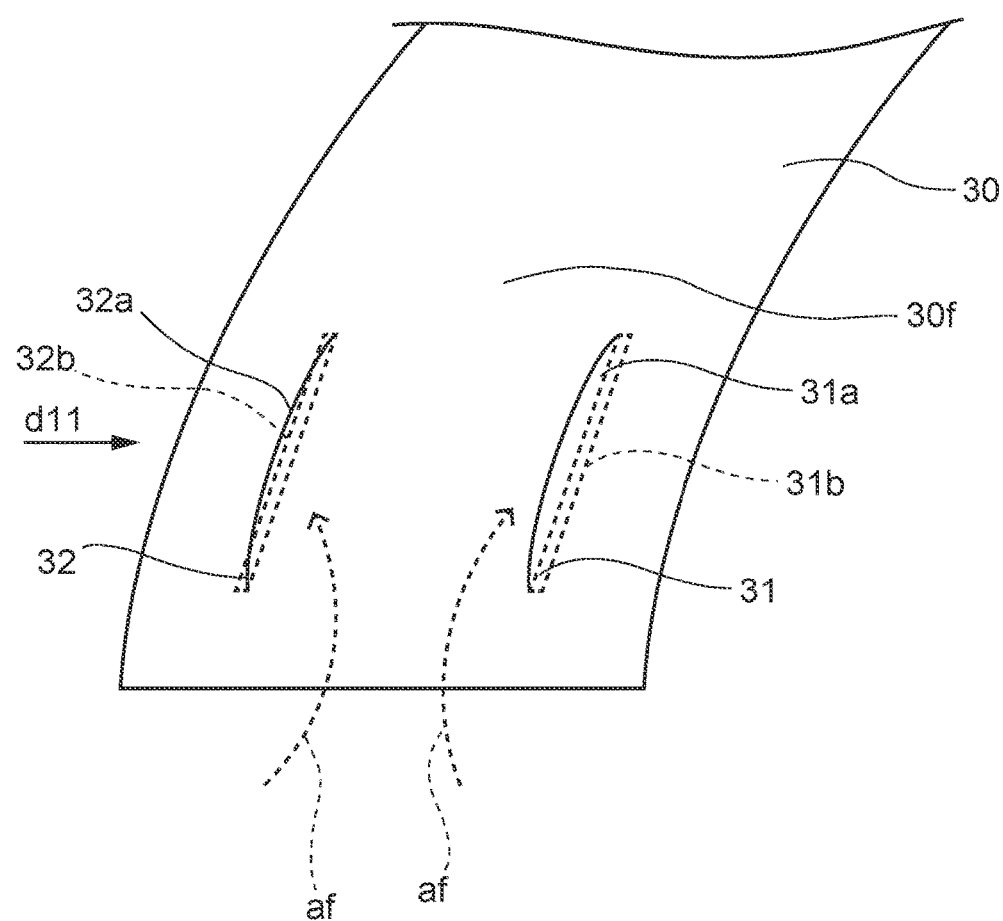
FIG. 10 is a perspective view showing the principal part of the pressure regulation film, transformed in an upward curving shape.
Figure 11:
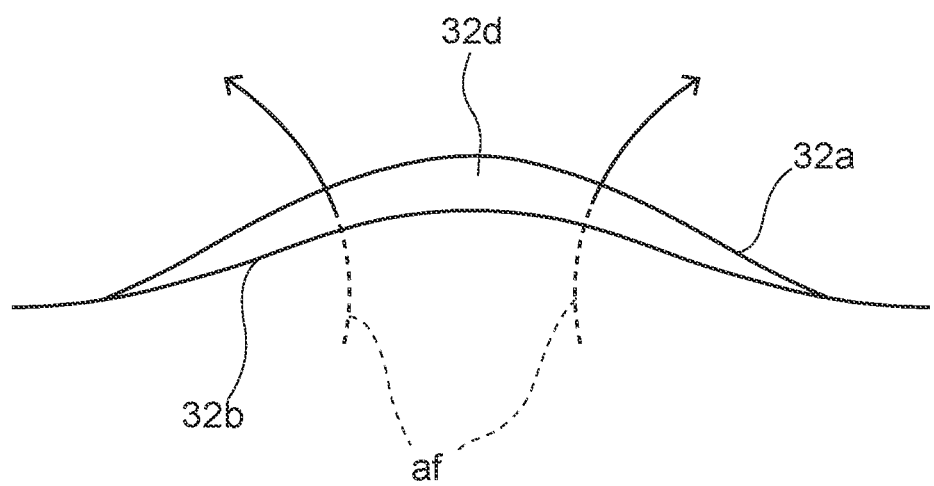
FIG. 11 is a side elevation view showing the principal part of the pressure regulation film, shown from the direction along with d11 in FIG. 10.

As illustrated in FIG. 9(*a*), FIG. 9(*b*), FIG. 10, FIG. 11, a difference, about the curving condition between an intermediate space of the first, second slits 31, 32 (transformable part 30*f*) and outsides of the first, second slits 31, 32, occurs. In this case, about the second slit 32, an inside line 32*a* curves largely than an outside line 32*b* (about the first slit 31, an inside line also curves largely than an outside line, similar with the second slit 32). Then, as illustrated in FIG. 11, a bow shape gap 32*d* is formed between the inside line 32*a* and the outside line 32*b* (about the first slit 31, the bow shape gap is also formed).

Therefore, the air stream af passes through the bow shape gap 32*d* from the inside of the transformable part 30*f*, and it flows out to the outside of the transformable part 30*f*. Then air pressure, in the inside of the transformable part 30*f*, is lowered.

Accordingly, the pressure regulation film 30 is formed, thereby air pressure, caused by the sound wave or the wind pressure, which enters the front chamber 99D, is attenuated. In this way, in case of the MEMS package 1 and the MEMS microphone 100, because internal air pressure is regulated by the pressure regulation film 30, breakage of the membrane 3 is able to be avoided.

A bow shape gap is formed, in accordance with entering of the air stream af, to attenuate the internal air pressure only one of the first, second slits 31, 32 is formed. Therefore, breakage of the membrane 3 is able to be avoided.

About this point, because the MEMS package 1 and the MEMS microphone 100 has the two-slit structure, two bow shape gaps, in accordance with the entering of the air stream af, are formed. Therefore, the air stream af is surely exhausted. Therefore, in the MEMS package 1 and the MEMS microphone 100, breakage of the membrane 3 is surely avoided by the two-slit structure.

Figure 12:
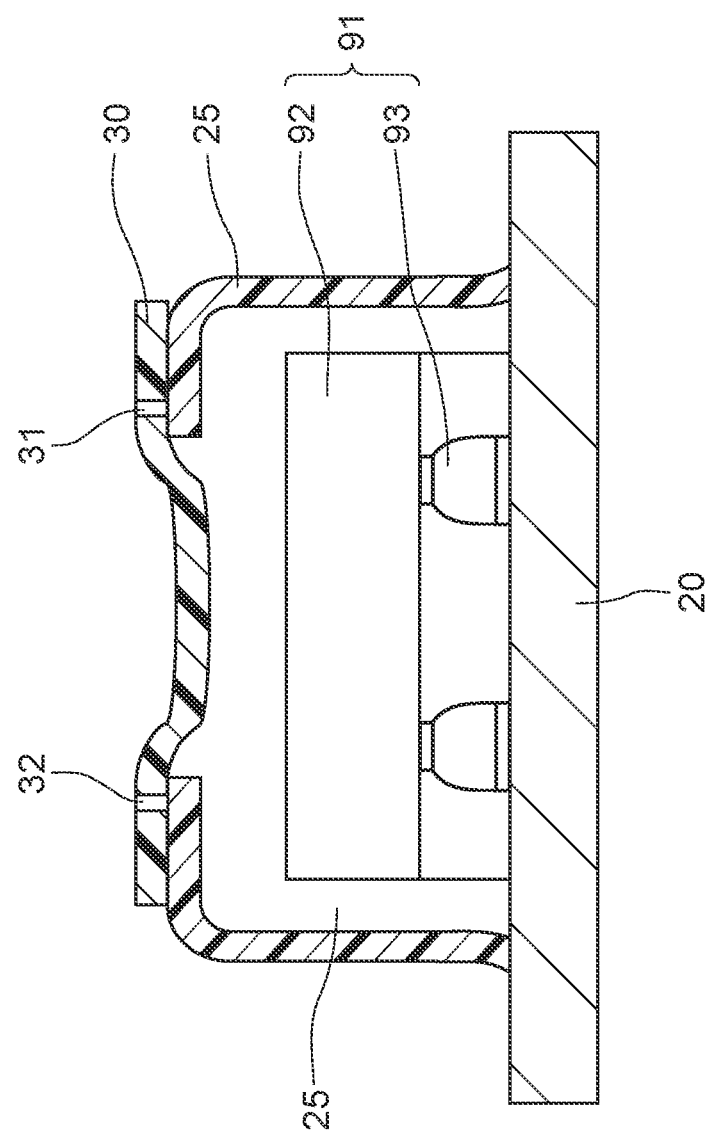
FIG. 12 is a sectional view, corresponding to FIG. 4, showing the MEMS package which the pressure regulation film is transformed in a downward curving shape.

On the other hand, when another air stream ag, on the reverse direction (outside direction from front chamber 99D through the sound hole 20*b*) of the air stream af, is generated, as illustrated in FIG. 12, the pressure regulation film 30 curves in a downward curving shape. In this case, because the internal air pressure is regulated by the pressure regulation film 30, having the first, second slits 31, 32, breakage of the membrane 3 is avoided.

Further, in the MEMS package 1 and the MEMS microphone 100, the first, second slits 31, 32 are formed along with the long side direction. Therefore, as illustrated in FIG. 10, the curving condition of the first, second slits 31, 32 coincides the curving condition of the pressure regulation film 30. As the result, the bow shape gaps are surely formed in the first, second slits 31, 32.

The vent 25*b* is formed in the middle area 25*em* though, the lower part of the middle area 25*em* is a space having no member. Therefore, the transformation of the pressure regulation film 30, by the air stream af, is surely secured.

On the other hand, in the MEMS package 1 and the MEMS microphone 100, the pressure regulation film 30 covers the vent 25*b*, under the condition which the first, second slits 31, 32 are arranged outside than the vent 25*b*. Therefore, in the MEMS package 1 and the MEMS microphone 100, the normal condition, with no air stream af, the front chamber 99D is sealed. Further, when the air stream af by the loud sound or the large wind pressure enters, the stream af flows out outside of the front chamber 99D caused by the above-described operation of the pressure regulation film 30, thereby a rise of the air pressure, in the front chamber 99D, is suppressed.

Then, in the MEMS package 1 and the MEMS microphone 100, the pressure regulation film 30 does not contact the membrane 3. Because the pressure regulation film 30 is arranged, being distant from the membrane 3, outside of the MEMS chip 10, the operation of the membrane 3 is not affected by the pressure regulation film 30. Further, the member, having a pressure regulating function for prevention of a breakage of the membrane 3, is not arranged between the sound hole 20*b* and the membrane 3. Therefore, the sound wave, passes through the sound hole 20*b*, directly reaches the membrane 3. Therefore, the pressure, which act on the membrane 3, is not attenuated by the member having pressure regulating function. Accordingly, in the MEMS package 1 and the MEMS microphone 100, lowering sensitivity, by the member having pressure regulating function, never occurs.

As described above, the MEMS package 1 and the MEMS microphone 100 are constituted so as to be able to prevent a breakage of the membrane 3, without lowering the sensitivity, by the pressure regulation film 30.

Moreover, in the MEMS package 1, the front chamber 99D is formed by the chip cover 25 and the pressure regulation film 30. The cap 99 is mounted on the MEMS package 1 to form the back chamber 99A, thereby the MEMS microphone 100 is obtained. Both the front chamber 99D and the back chamber 99A, having certain size, are secured, moreover, size balance is secured. Therefore, sensitivity of the MEMS microphone 100 is good.

First Modified Example

Figure 13:
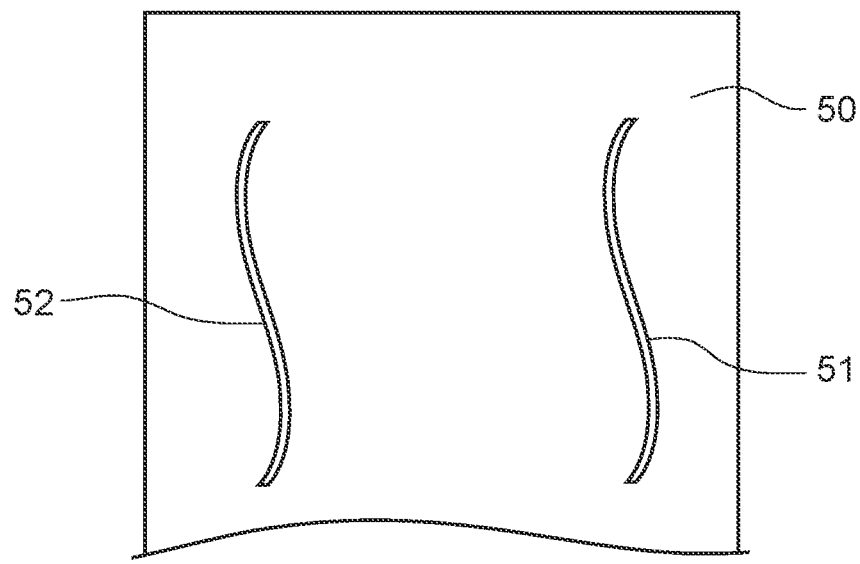
FIG. 13 (a) is a plan view, partially omitted, showing a principal part of the pressure regulation film according to the modified example, FIG. 13 (b) is a plan view, partially omitted, showing a principal part of the pressure regulation film according to another modified example.
Figure 13:
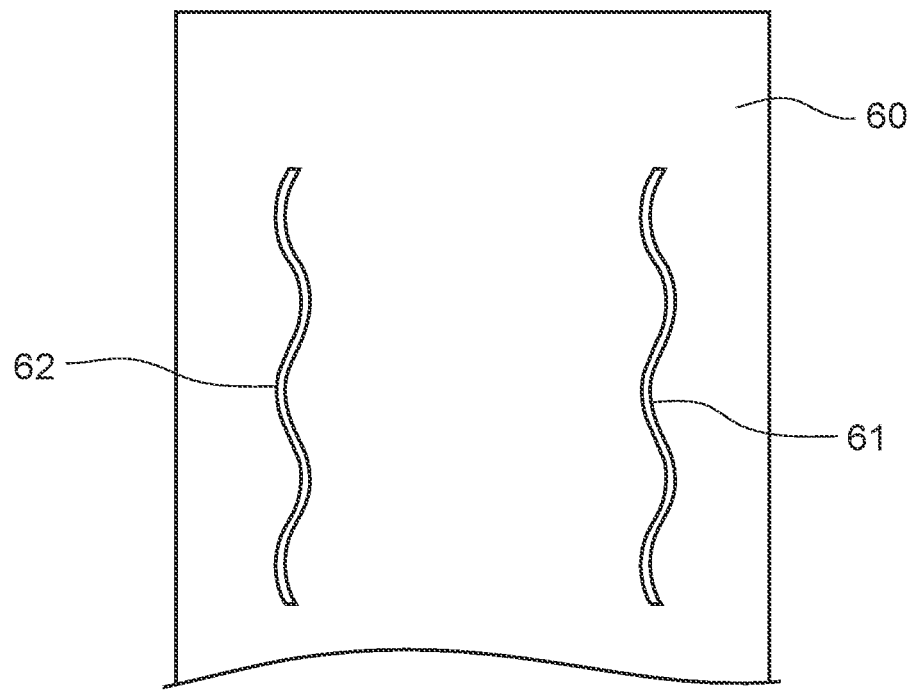

Next, the pressure regulation film 50, according to a first modified example, is explained with reference to FIG. 13(*a*), FIG. 13(*b*). FIG. 13 (*a*) is a plan view, partially omitted, showing the pressure regulation film 50 according to the modified example, FIG. 13 (b) is a plan view, partially omitted, showing the pressure regulation film 60 according to another modified example.

The pressure regulation film 50 is different in that it has the first, second slits 51, 52 instead of the first, second slits 31, 32, as compared with the pressure regulation film 30. The first, second slits 31, 32 are formed in straight lines though, the first, second slits 51, 52 are formed in s-figure like shape in a plan view. Because the pressure regulation film 50 has the same operation and effect with the pressure regulation film 30, the MEMS package and the MEMS microphone (not illustrated), having the pressure regulation film 50, have the operation and effect similar with the MEMS microphone 100.

The pressure regulation film 60 has the first, second slits 61, 62 though, the first, second slits 61, 62 are formed in a meandering figure, connecting a plurality of s-figures in a plan view. Because the pressure regulation film 60 has the same operation and effect with the pressure regulation film 30, the MEMS package and the MEMS microphone (not illustrated), having the pressure regulation film 60, have the operation and effect similar with the MEMS package 1 and the MEMS microphone 100.

Second Modified Example

Figure 20:
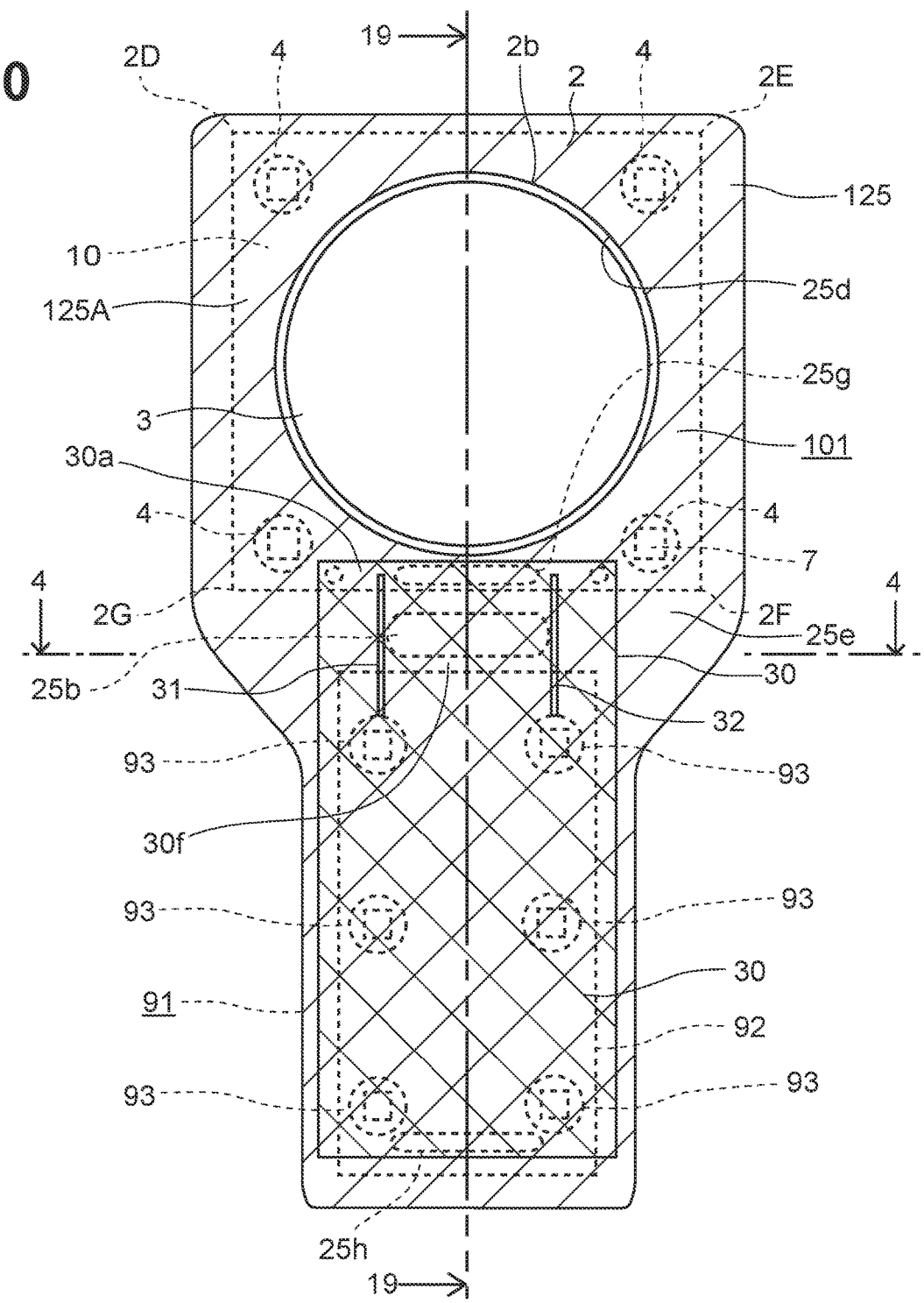
FIG. 20 is a plan view showing a principal part of the MEMS package according to the modified example.
Figure 21:
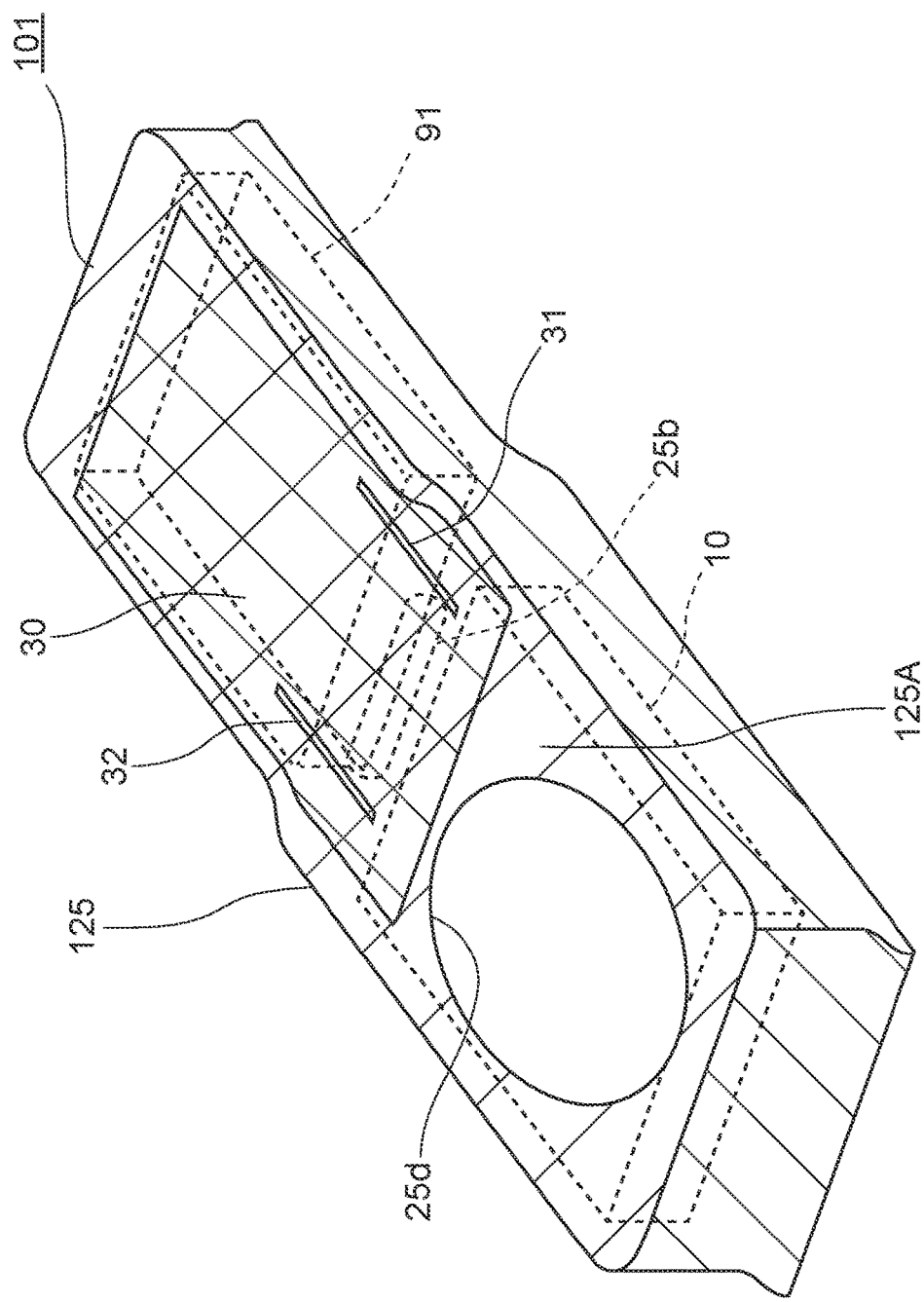
FIG. 21 is a perspective view showing the MEMS package according to the modified example.

Next, the MEMS package 101 and the MEMS microphone 110, according to the second modified example, are explained with reference to FIG. 19 to FIG. 21.

Figure 19:
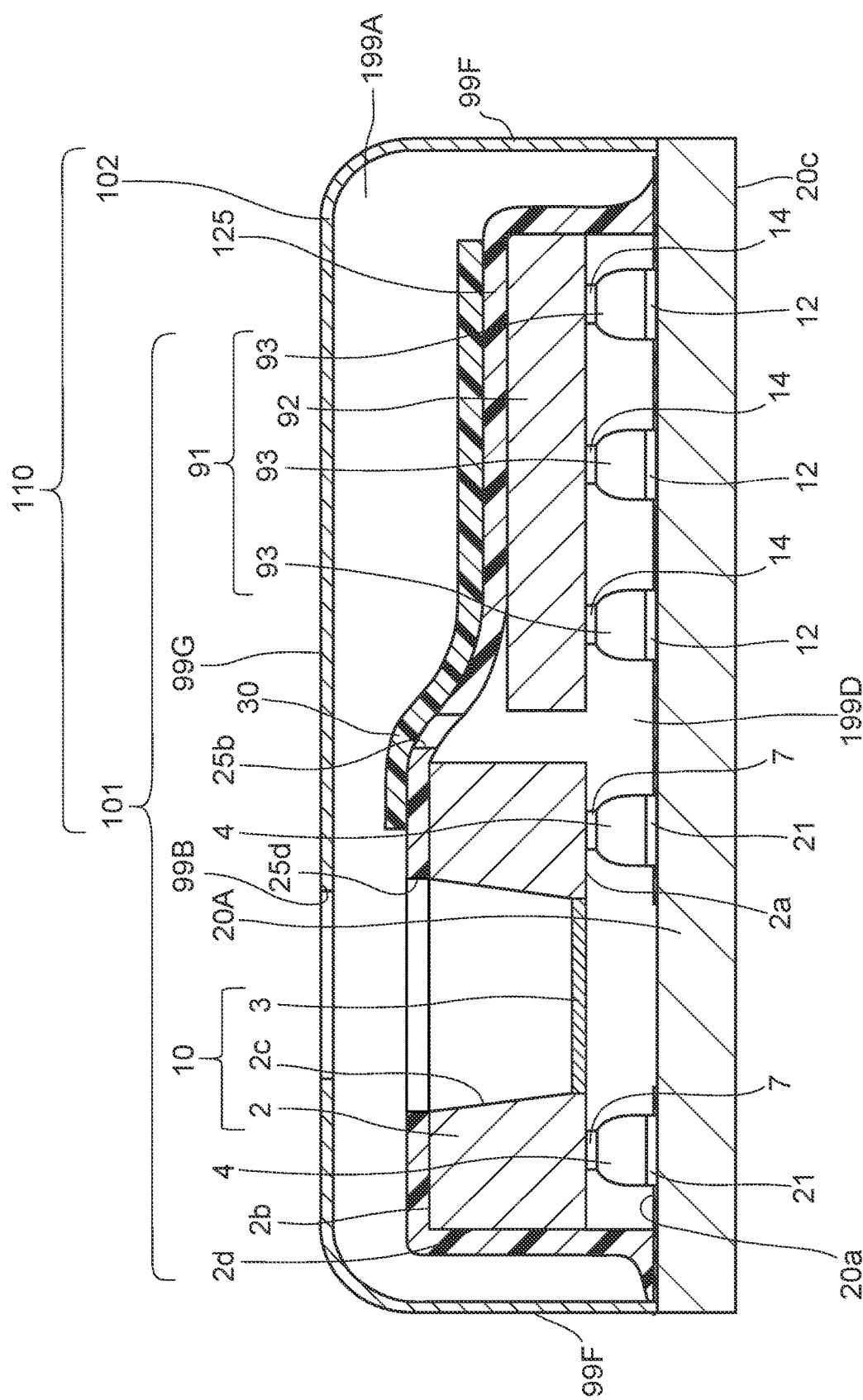
FIG. 19 is a sectional view, corresponding to FIG. 1, showing the MEMS microphone having the MEMS package according to the modified example.

FIG. 19 is a sectional view, corresponding to FIG. 1, showing the MEMS microphone 110 having the MEMS package 101 according to the modified example. FIG. 20 is a plan view showing a principal part of the MEMS package 101. FIG. 21 is a perspective view showing the MEMS package 101.

The MEMS microphone 110 is different in that it has the MEMS package 101 instead of the MEMS package 1, it has the cap 102 instead of the cap 99, and it has the top port structure instead of the bottom port structure, as compared with the MEMS microphone 100. The MEMS package 101 is different in that it has the package substrate 20A instead of the package substrate 20, and it has a chip cover 125 instead of the chip cover 25.

The cap 102 is different in that it has the top surface 99G instead of the top surface 99E, as compared with the cap 99. A top hole 99B is formed in the top surface 99G. The top hole 99B is a hole having a circular shape, and it is arranged in the position in accordance with a later-described cover hole part 25d.

The package substrate 20A is different in that it does not have the sound hole 20b, as compared with the package substrate 20.

The chip cover 125 is different in that it has the cover hole part 25d, as compared with the chip cover 25. The cover hole part 25d is formed in almost the center of a chip corresponding part 125A of the chip cover 125. The chip corresponding part 125A is a part, of the chip cover 125, which is arranged on the MEMS chip 10 (on the chip surface 2b of the element substrate 2).

The cover hole part 25d is formed in a circular shape in accordance with the hole-part 2c of the element substrate 2. The cover hole part 25d is formed in the position in accordance with the hole-part 2c. Further, the center of the cover hole part 25d is overlapped to the hole-part 2c, and they have the same diameter, the cover-hole-part 25d communicates with the hole-part 2c.

The first closed-space, surrounded by the chip cover 125, the pressure regulation film 30 and the package substrate 20A, is formed in the MEMS microphone 110. The first closed-space is a space which arranged inside more than the chip cover 125. Further, because the first closed-space is a space which arranged rear side more than the membrane 3, it corresponds to the back chamber 199D. The ASIC package 91 is arranged inside the chip cover 125 of the back chamber 199D.

Further, the second closed-space, surrounded by the top-surface 99G and the cap-side-surface 99F of the cap 102, the chip cover 125 and the pressure regulation film 30, is formed in the MEMS microphone 110. The second closed-space is a space which arranged inside more than the cap 102, and it is a space which arranged outside more than the chip cover 125 and the pressure regulation film 30. Because the second closed-space is arranged front side of the membrane 3, it corresponds to the front chamber 199A.

On the other hand, when the MEMS package 101 and the MEMS microphone 110 are manufactured, the steps from the mounting step to the chip cover forming step are performed, similar with the manufacturing steps of the MEMS package 1.

Then, after the chip cover forming step is performed, a cover hole part forming step is performed. In the cover hole part forming step, unnecessary parts are removed with laser for the formed chip cover. In this case, part of the formed chip cover, corresponding to the hole part 2c, are removed, as unnecessary part. Then, the cover hole part 25d, as illustrated in FIG. 21, is formed to form the chip cover 125.

After that, the pressure regulation film forming step and the panel cutting step are performed similar with the method of manufacturing the MEMS package 1, to manufacture the MEMS package 101 and MEMS microphone 110.

Because the above-described MEMS package 101 and the MEMS microphone 110 have also the chip cover 125 and the pressure regulation film 30, similar with the MEMS package 1 and the MEMS microphone 100, the MEMS package 101 and the MEMS microphone 110 have the operation and effect similar with the MEMS package 1, the MEMS microphone 100.

Third Modified Example

Figure 22:
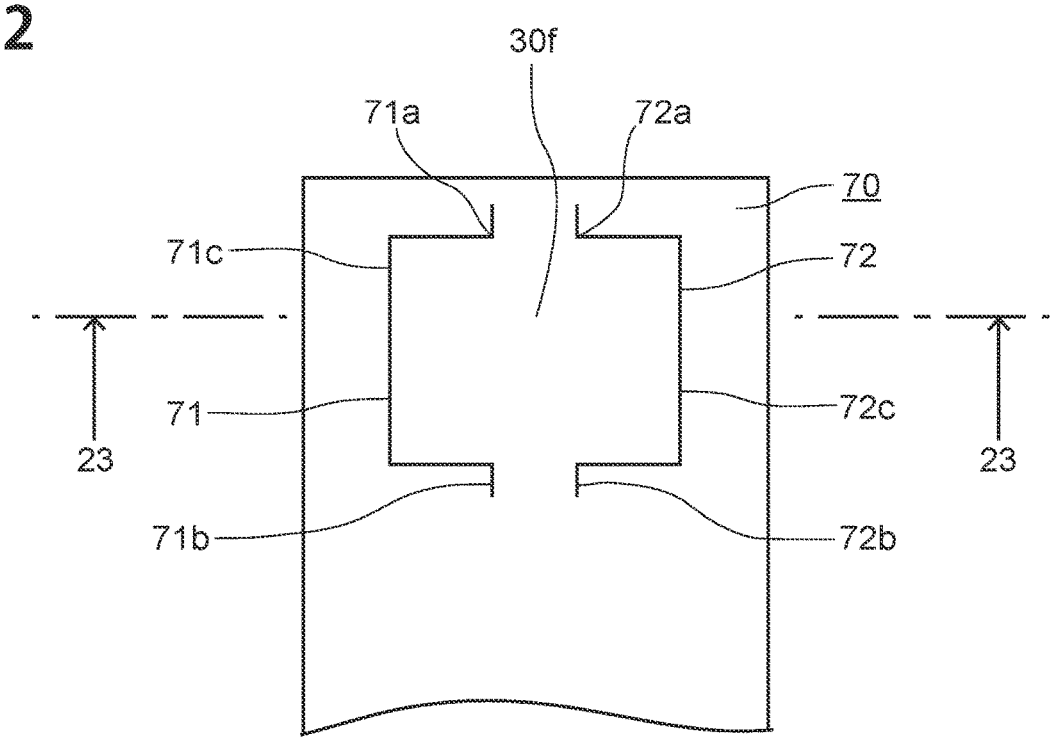
FIG. 22 is a plan view, partially omitted, showing the pressure regulation film according to the third modified example.
Figure 23:
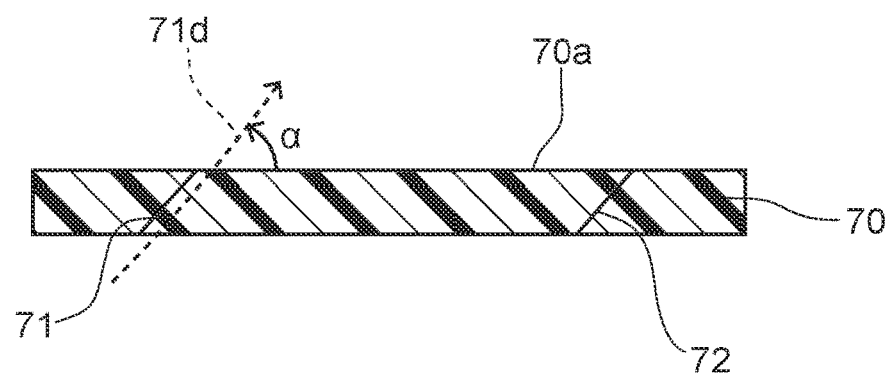
FIG. 23 is a sectional view of a part corresponding to the line 23-23 in FIG. 22.
Figure 24:
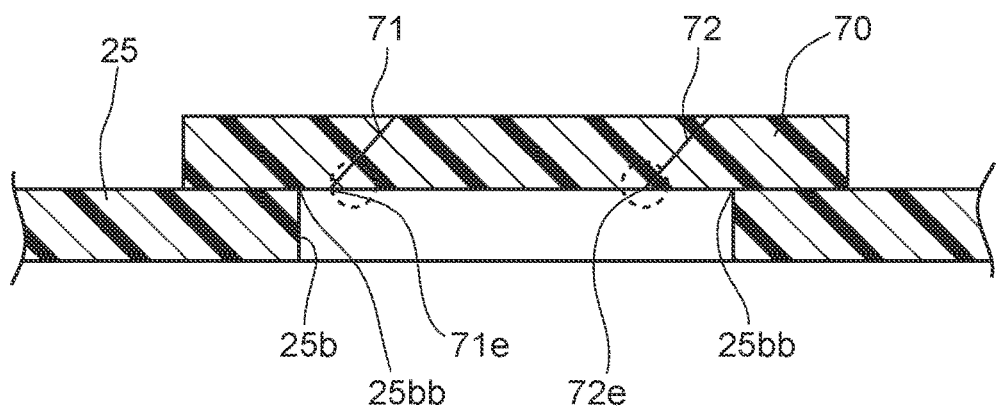
FIG. 24 is a sectional view showing the principal part of the pressure regulation film and the chip cover, according to the third modified example.

Next, the pressure regulation film 70, according to the third modified example, is explained with reference to FIG. 22 to FIG. 24. Here, FIG. 22 is a plan view, partially omitted, showing the pressure regulation film 70 according to the third modified example. FIG. 23 is a sectional view of a part corresponding to the line 23-23 in FIG. 22. FIG. 24 is a sectional view showing the principal part of the pressure regulation film 70 and the chip cover 25.

The pressure regulation film 70 is different in that it has first, second cut-lines 71, 72 instead of the first, second slits 31, 32, as compared with the pressure regulation film 30. The first, second slits 31, 32 are formed along with the direction vertically intersecting with the surface though, as illustrated in FIG. 23, the first, second cut-lines 71, 72 are formed along with a slanting direction, which forms an acute angle or an obtuse angle with the surface 70a. For example, in case of the first cut-line 71, the first cut-line 71 is formed so that the passing-direction 71d, passing through the first cut-line 71, forms the acute angle $\alpha$ with the surface 70a. The pressure regulation film 70 has a two-lines structure including the first cut-line 71 and the second cut-line 72. The first cut-line 71 has two end parts 71a, 71b and a middle part 71c being formed in a modified c-figure shape in a plan view.

The second cut-line 72 has two end parts 72a, 72b and a middle part 72c being formed in a modified c-figure shape in a plan view.

Further, as illustrated in FIG. 24, the pressure regulation film 70 is arranged to the chip cover 25 in the following appropriate position. The appropriate position means the position which internal end parts 71e, 72e, on the chip cover 25 side, of the first, second cut-lines 71, 72 are arranged inside than the edge parts 25bb, 25bb of the vent 25b. The first, second cut-lines 71, 72, including internal end parts 71e, 72e, are entirely arranged inside than the edge parts 25bb, 25bb.

Then, because the first, second cut-lines 71, 72 are not narrow openings having width such as the first, second slits 31, 32, they are closed ordinarily. Therefore, even then the pressure regulation film 70 is arranged in the appropriate position, the vent 25b is closed with pressure regulation film 70.

Figure 25:
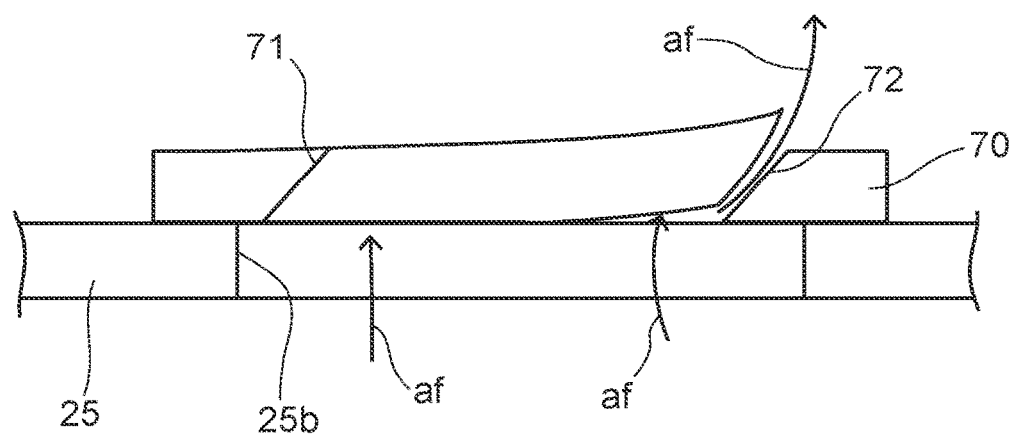
FIG. 25 is a sectional view showing the pressure regulation film, transformed in an upward curving shape and chip cover according to the third modified example.

However, as illustrated in FIG. 25, when the air stream af occurs, the pressure regulation film 70 is partially lifted by the air stream af and the vent 25b is opened. At this time, the pressure regulation film 70 partially bends, so the two edge lines of the first cut line 71 or the second cut line 72 are separated each other, thereby a slight gap is formed in their between. Therefore, the air stream af passes through the first, second cut-lines 71, 72 from the chip cover 25 side, and it is exhausted outside the pressure regulation film 70.

Figure 26:
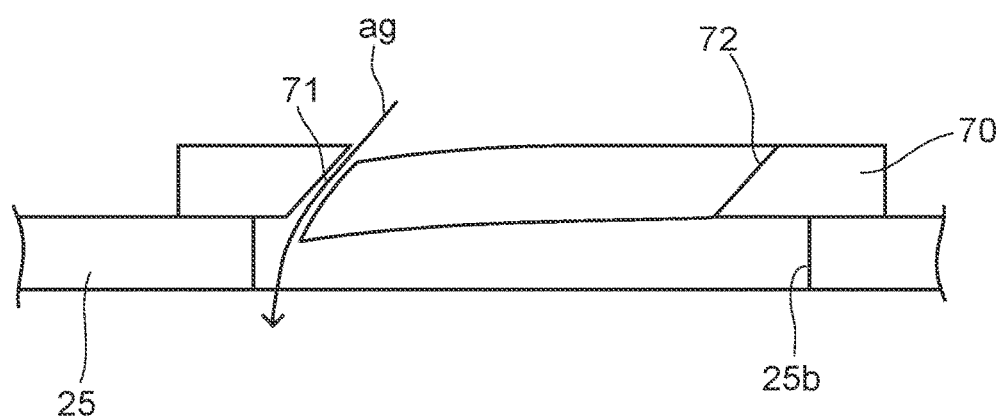
FIG. 26 is a sectional view showing the pressure regulation film, transformed in a downward curving shape and chip cover according to the third modified example.

Further, as illustrated in FIG. 26, when the air stream ag occurs, the pressure regulation film 70 is partially inhaled by the air stream ag. At the time, the pressure regulation film 70 also partially bends, so the two edge lines of the first cut line 71 or the second cut line 72 are also separated each other, thereby a slight gap is formed in their between. Therefore, the air stream ag enters inside of the chip cover 25, passing through the first, second cut-lines 71, 72. Accordingly, both of the air streams af, ag are able to be dealt with the pressure regulation film 70.

Because the pressure regulation film 70 has the same operation and effect with the pressure regulation film 30, the MEMS package and the MEMS microphone (not illustrated), having the pressure regulation film 70, have the operation and effect similar with the MEMS package 1 and the MEMS microphone 100.

Fourth Modified Example

Next, the MEMS package 201 and the MEMS microphone 200, according to the fourth modified example, are explained with reference to FIG. 27 to FIG. 30.

Figure 27:
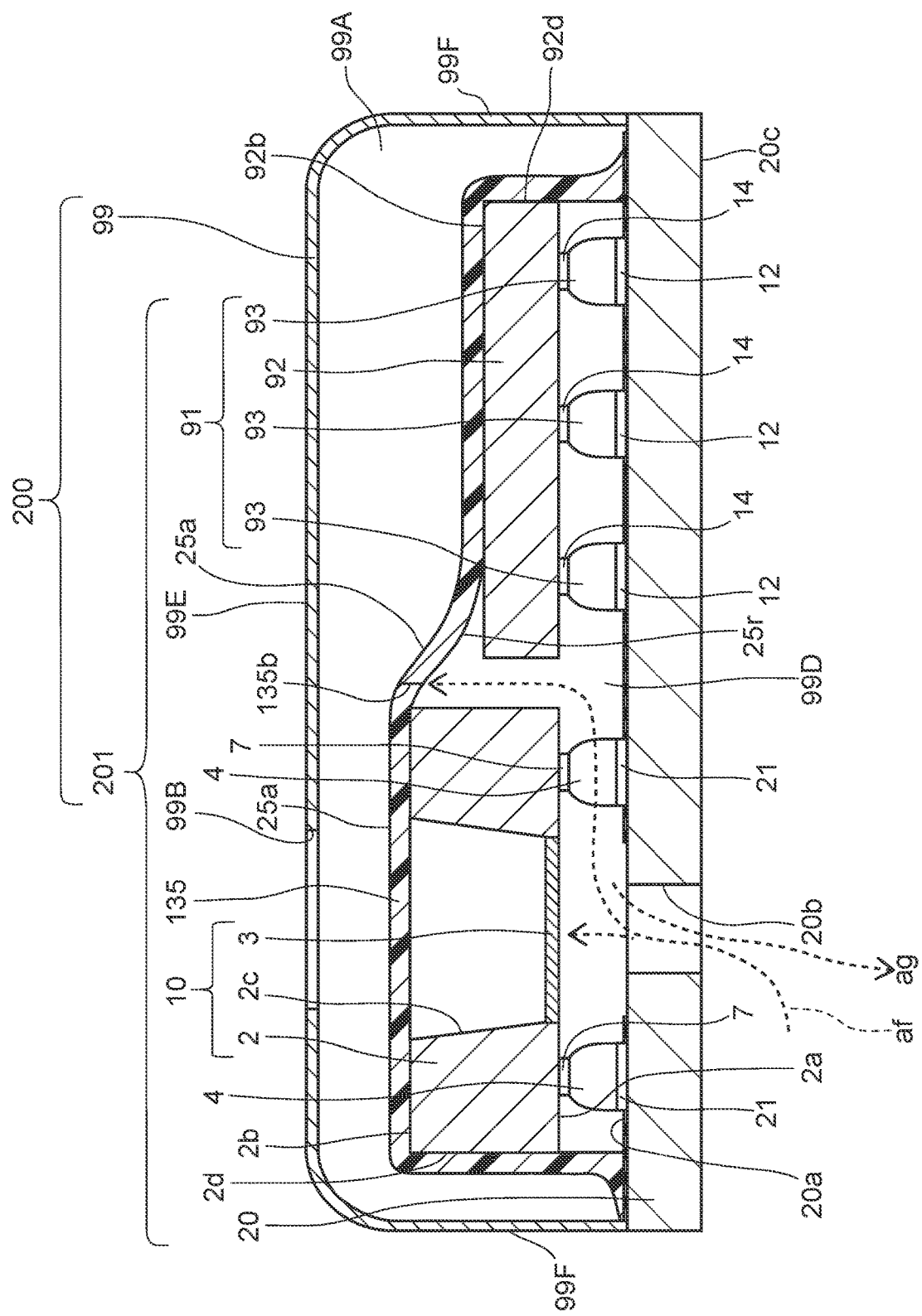
FIG. 27 is a sectional view, corresponding to FIG. 1, showing the MEMS microphone having the MEMS package according to the fourth modified example.
Figure 28:
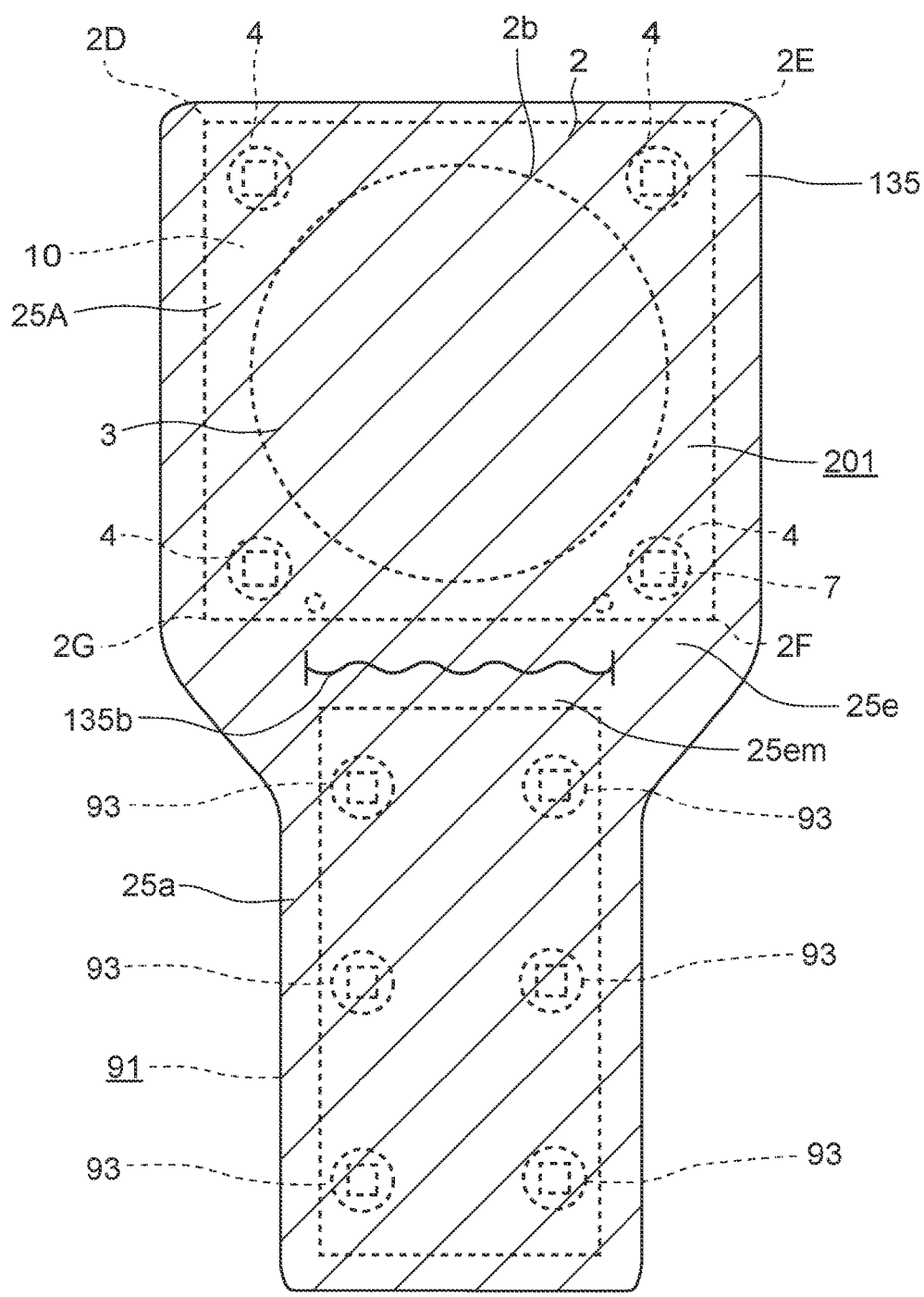
FIG. 28 is a plan view, corresponding to FIG. 5, showing a principal part of the MEMS package, according to the fourth modified example.
Figure 29:
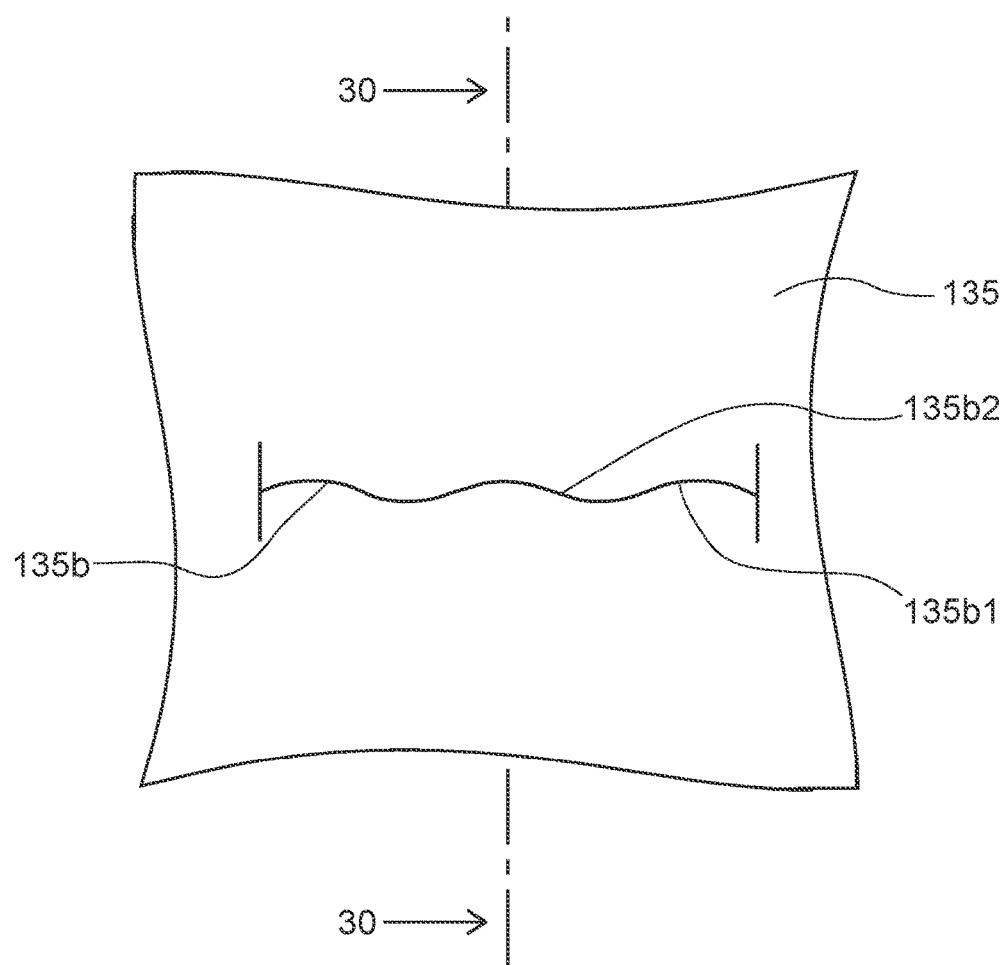
FIG. 29 is a plan view showing a principal part of the chip cover according to the fourth modified example.
Figure 30:
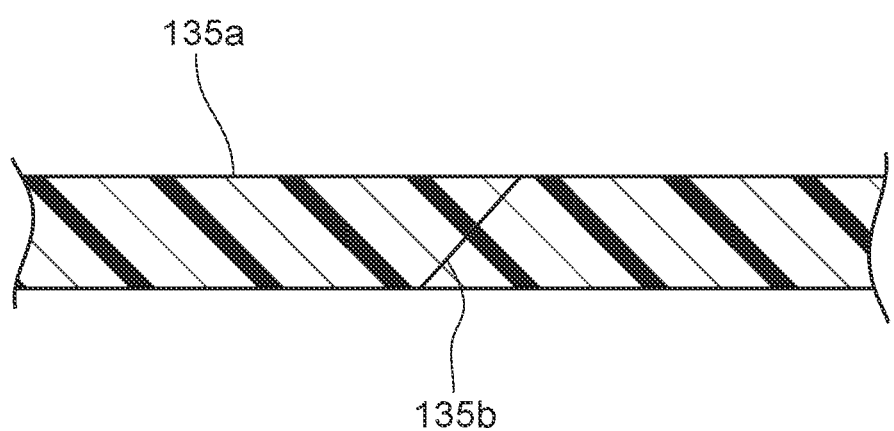
FIG. 30 is a sectional view of a part corresponding to the line 30-30 in FIG. 29.

FIG. 27 is a sectional view, corresponding to FIG. 1, showing the MEMS microphone 200 having the MEMS package 201 according to the fourth modified example. FIG. 28 is a plan view showing a principal part of the MEMS package 201. FIG. 29 is a plan view showing a principal part of the chip cover 135. FIG. 30 is a sectional view of a part corresponding to the line 30-30 in FIG. 29.

The MEMS microphone 200 is different in that it has the MEMS package 201 instead of the MEMS package 1, as compared with the MEMS microphone 100. The MEMS package 201 is different in that it has the chip cover 135 instead of the chip cover 25, and it does not have the pressure regulation film 30, as compared with the MEMS package 1.

As illustrated in FIG. 28, the chip cover 135 is different in that a cut-line 135b is formed instead of the vent 25b, as compared with the chip cover 25.

As illustrated in FIG. 29, the cut-line 135b is formed in a meandering figure, connecting a plurality of s-figures in a plan view. Further, the cut-line 135b is formed along with a slanting direction, which forms an acute angle or an obtuse angle with the surface 135a. The cut-line 135b is a part, of the chip cover 135, which is cut in line shape, and the cut-line 135b is formed in the middle area 25em. Because the cut-line 135b is not narrow opening having width such as the first, second slits 31, 32, it is closed ordinarily. Namely, two edge lines 135b1, 135b2, which form the cut-line 135b, are ordinarily in contact with each other.

Figure 31:
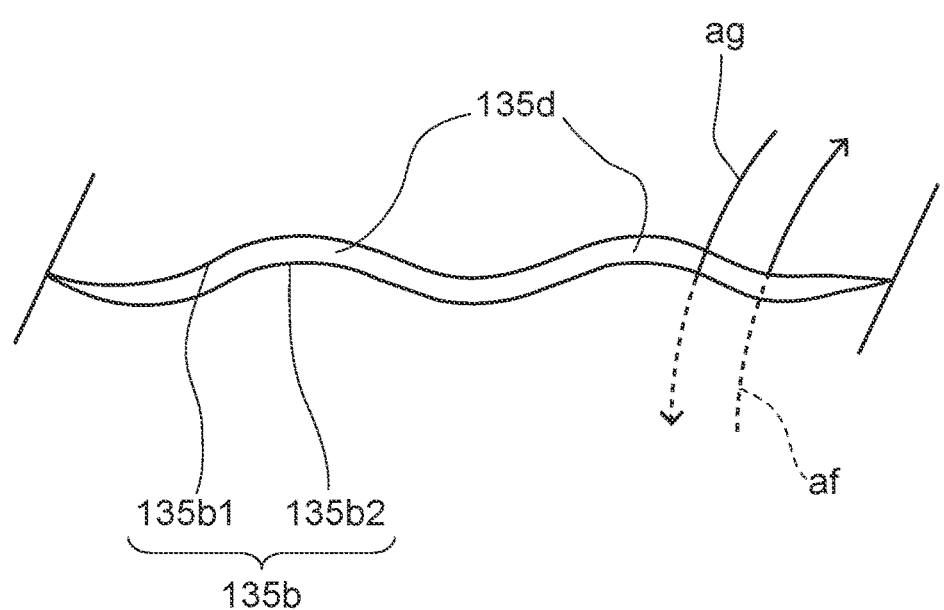
FIG. 31 is a plan view showing a cut-line when a gap is formed.
Figure 32:
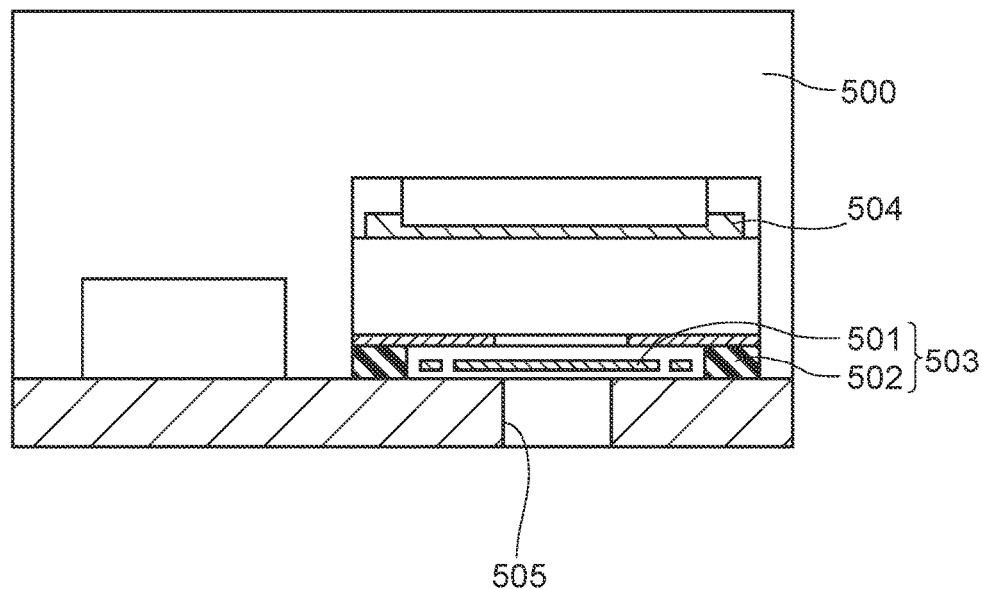
FIG. 32 is a sectional view showing the conventional MEMS microphone.
Figure 33:
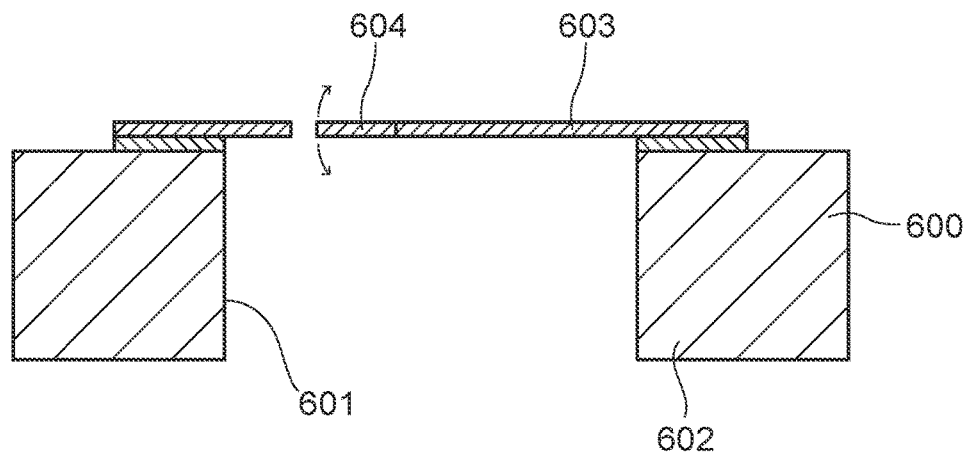
FIG. 33 is a sectional view showing another conventional MEMS microphone different from FIG. 32.

However, when the air stream af occurs, the chip cover 135 is lifted by the air stream af and the chip cover 135 bends. Then, as illustrated in FIG. 31, the two edge lines 135b1, 135b2, forming the cut-line 135b, are separated each other, thereby a slight gap 135d is formed in there between. Then, the air stream af is exhausted outside the chip cover 135, passing through the gap 135d.

Further, when the air stream ag occurs, the chip cover 135 is inhaled by the air stream ag, and the chip cover 135 bends. In this case, the two edge lines 135b1, 135b2, forming the cut-line 135b, are also separated each other, thereby a slight gap 135d is formed in their between. Therefore, the air stream ag enters inside of the chip cover 135 passing through the gap 135d, and the air stream ag is exhausted outside passing through the sound hole 20b. Therefore, both of the air streams af, ag are able to be dealt with the chip cover 135.

Accordingly, the MEMS package and the MEMS microphone (not illustrated), having the chip cover 135, have the operation and effect similar with the MEMS package 1 and the MEMS microphone 100.

The type "double back-plate", having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
   a MEMS chip;
   a package substrate which the MEMS chip is adhered;
   a chip cover which is adhered to the package substrate and which wraps the MEMS chip; and
   a pressure regulation film which is adhered to the front surface of the chip cover;
   wherein the chip cover has a vent which is formed in a chip outside area, arranged outside than the MEMS chip,
   wherein the pressure regulation film has a slit,
   wherein the slit is arranged in the neighborhood of the vent and the vent is covered with the pressure regulation film.

2. The MEMS package according to claim 1, further comprising:
   an ASIC package which is adhered to the package substrate;

wherein the chip cover wraps the ASIC package together with the MEMS chip, wherein the vent is arranged in a middle area, of the chip outside area, between the MEMS chip and the ASIC package.

3. The MEMS package according to claim 1,
wherein the pressure regulation film has a two-slits structure including a first slit and a second slit, as the slit.

4. The MEMS package according to claim 3,
wherein the first slit and the second slit are formed outside the vent so as to oppose to each other via the vent.

5. The MEMS package according to claim 4,
wherein the pressure regulation film has a transformable part, which is transformed with air stream passing through the vent, arranged between the first slit and the second slit.

6. The MEMS package according to claim 1,
wherein the pressure regulation film is formed in a rectangular shape so as to struggle the MEMS chip and the ASIC package,
wherein the slit is formed along with the long side of the pressure regulation film.

7. The MEMS package according to claim 1,
wherein the pressure regulation film is formed in a rectangular shape so as to struggle the MEMS chip and the ASIC package, and end parts of the both sides along with the long side, are respectively adhered to a chip area of the chip cover, arranged on the MEMS chip, and a package area of the chip cover, arranged on the ASIC package.

8. The MEMS package according to claim 1,
wherein the MEMS chip is mounted on the package substrate by a FCB,
wherein the chip cover is formed so as to be in contact with a chip surface, being the outer surface of the MEMS chip, and the side surface of the MEMS chip.

9. The MEMS package according to claim 1, further comprising:
a sealed structure which the chip cover seals the MEMS chip and the ASIC package, and the pressure regulation film covers the vent;
wherein the sealed structure forms a front chamber.

10. The MEMS package according to claim 1,
wherein the pressure regulation film is made of rubber material having flexibility or resin material having flexibility.

11. A MEMS package comprising:
a MEMS chip;
a package substrate which the MEMS chip is adhered;
a chip cover which is adhered to the package substrate and which wraps the MEMS chip; and
a pressure regulation film which is adhered to the front surface of the chip cover;
wherein the chip cover has a vent which is formed in a chip outside area, arranged outside than the MEMS chip,
wherein the pressure regulation film has a cut-line,
wherein the cut-line is arranged in the neighborhood of the vent and the vent is covered with the pressure regulation film.

12. The MEMS package according to claim 11,
wherein the pressure regulation film has a two-lines structure including a first cut-line and a second cut-line, as the cut-line.

13. The MEMS package according to claim 12,
wherein the first cut-line and the second cut-line are formed along with a slanting direction, which forms an acute angle or an obtuse angle with a surface of the pressure regulation film.

14. The MEMS package according to claim 1,
wherein the MEMS chip comprises an element substrate which a movable element is formed,
wherein the element substrate comprises a hole-part which the movable element is arranged,
wherein the chip cover comprises a cover hole part formed in accordance with the hole-part.

15. The MEMS package according to claim 14, further comprising:
a back chamber which is surrounded by the chip cover and the package substrate.

16. A MEMS package comprising:
a MEMS chip;
a package substrate which the MEMS chip is adhered; and
a chip cover which is adhered to the package substrate and which wraps the MEMS chip;
wherein the chip cover has a cut-line which is formed in a chip outside area, arranged outside than the MEMS chip,
wherein the cut-line is a part, of the chip cover, which is cut in line shape,
wherein the cut-line is formed in a middle area, of the chip outside area, between the MEMS chip and an ASIC package.

17. The MEMS package according to claim 16,
wherein the cut-line is formed in a s-figure in a plan view or in a meandering figure connecting a plurality of s-figures in a plan view.

18. The MEMS package according to claim 16,
wherein the cut-line is formed along with a slanting direction, which forms an acute angle or an obtuse angle with a surface of the chip cover.

19. A MEMS microphone comprising:
a MEMS package; and
a cap which wraps the MEMS package;
wherein the MEMS package comprises a MEMS chip, a package substrate which the MEMS chip is adhered, a chip cover which is adhered to the package substrate and which wraps the MEMS chip, and
a pressure regulation film which is adhered to the front surface of the chip cover;
wherein the chip cover has a vent which is formed in a chip outside area, arranged outside than the MEMS chip;
wherein the pressure regulation film has a slit;
wherein the slit is arranged in the neighborhood of the vent and the vent is covered with the pressure regulation film.

20. The MEMS microphone according to claim 19,
wherein the cap comprises a top-surface, which is formed so as to oppose to the package substrate, and a cap-side-surface, which surrounds the top-surface and adhered to the package substrate,
wherein the MEMS microphone further comprising a back chamber which is formed between the top-surface, the cap-side-surface of the cap and the chip cover, the pressure regulation film.

21. The MEMS microphone according to claim 19, further comprising:
a front chamber which is surrounded by the chip cover, the pressure regulation film and the package substrate.

22. The MEMS microphone according to claim 19,
wherein the MEMS chip comprises an element substrate which a movable element is formed,
wherein the element substrate comprises a hole-part which the movable element is arranged,
wherein the chip cover comprises a cover hole part formed in accordance with the hole-part.

23. The MEMS microphone according to claim 22, further comprising:
a back chamber which is surrounded by the chip cover, the pressure regulation film and the package substrate.

24. A method of manufacturing a MEMS package, using a MEMS chip, an ASIC and a package substrate comprising:
a mounting step for mounting the MEMS chip and the ASIC, by a FCB, on each of package regions of a package-panel which a plurality of package regions, for manufacturing the package substrate, are formed;
a cover member forming step for forming a cover member which wraps the MEMS chip and the ASIC with a heat-resistant adhesive sheet, being applied on the surface of the package-panel, by performing vacuum lamination;
a chip cover forming step for forming a chip cover by forming a vent in a part, of the cover member, arranged between the MEMS chip and the ASIC; and
a pressure regulation film forming step for forming a pressure regulation film by arranging a slit-formed film, which a slit is formed, in the neighborhood of the vent, and being adhered to the front surface of the chip cover so as to cover the vent.

25. The method of manufacturing a MEMS package according to claim 24,
wherein the MEMS chip comprises an element substrate which a movable element is formed,
wherein the element substrate comprises a hole-part which the movable element is arranged,
the method of manufacturing a MEMS package further comprising:
a cover hole part forming step for forming a cover hole part by removing a part, of the chip cover, corresponding to the hole-part.

26. The method of manufacturing a MEMS package according to claim 24,
wherein the chip cover forming step is performed so that the package-panel is heated to harden the heat-resistant adhesive sheet.

\* \* \* \* \*